United States Patent [19]

Stubbs et al.

[11] Patent Number: 5,136,705

[45] Date of Patent: Aug. 4, 1992

[54] METHOD OF GENERATING INSTRUCTION SEQUENCES FOR CONTROLLING DATA FLOW PROCESSES

[75] Inventors: David D. Stubbs; Mark P. Barnett; William A. Greenseth, all of Portland, Oreg.

[73] Assignee: Tektronix, Inc., Wilsonville, Oreg.

[21] Appl. No.: 711,723

[22] Filed: Jun. 10, 1991

Related U.S. Application Data

[63] Continuation of Ser. No. 206,649, Jun. 14, 1988, abandoned.

[51] Int. Cl.$^5$ .............................................. G06F 11/00
[52] U.S. Cl. ........................... 395/575; 364/DIG. 1; 364/DIG. 2; 364/221.7; 364/264; 364/266; 364/267.4; 364/921.8; 364/921.9; 364/943.9
[58] Field of Search .................. 395/DIG. 1, DIG. 2; 371/15.1, 16.1, 16.2, 16.5, 18, 19, 22.1, 23, 24, 25.1, 26, 27

[56] References Cited

U.S. PATENT DOCUMENTS

| | | | |
|---|---|---|---|
| 4,595,981 | 6/1986 | Leung | 371/19 |
| 4,742,467 | 5/1988 | Messerich et al. | 364/200 |
| 4,812,996 | 3/1989 | Stubbs | 364/487 |
| 4,868,785 | 9/1989 | Jordan et al. | 364/900 |
| 4,872,167 | 10/1989 | Maezawa et al. | 371/19 |

OTHER PUBLICATIONS

Berztiss, A. T., *Data Structures Theory and Practice*, 1971, Academic Press, Inc., pp. 223-231.
Dennis, Jack B., "Models of Data Flow Computation," IEEE Computer Society CompCon 1984, pp. 346-354.
French, S., *Sequencing and Scheduling: An Introduction to the Mathematics of the Job-Shop*, Ellis Horwood Limited, 1982, Chapter 12, pp. 193-198.
Gottlieb, C. C. and Gottlieb, L. R., *Data Types and Structures*, Prentice-Hall, 1978, pp. 275-278.
Hughes, J. "A High-Level Representation for Implementing Control-Flow Structures in Dataflow Programs," Center for Reliable Computing, Computer Systems Laboratory, Stanford University (CSL Technical Report No. 84-2, May 1982).
Dennis, J. B., Broy, M., "Control Flow and Data Flow: Concepts of Distributed Programming," Proceedings of NATO Advanced Study Institute International Summer School, Marktoberdorf, Germany, 1984, at 345-98.
*Signal Processing WorkSystem TM* Technical Backgrounder, Tektronix CAE Systems Division, 1987.
Knuth, Donald E., *Fundamental Algorithms*, Addison-Wesley, 1973, p. 258.
LabView Manual, National Instruments, Inc., Appendix A., 1986.

*Primary Examiner*—David Y. Eng
*Assistant Examiner*—Robert B. Harrell
*Attorney, Agent, or Firm*—Alexander C. Johnson; Micah D. Stolowitz; Francis I. Gray

[57] ABSTRACT

Computer-controlled test and measurement systems, including resources having multiple states and resources having multiple inputs, are modeled as data flow diagrams of topologically interconnected resources. A set of "tasks" are defined for changing the states of multiple-state resources and causing software resources to produce output data. Methods and apparatus, including internal and external task ordering rules, are provided to automatically interleave such tasks and implement input-ordering restrictions. Thereby, a sequence of tasks is produced to control the systems so as to assure valid data collection and protect physical resources from abuse. Data structures are illustrated for implementing the invention in an object-oriented programming environment.

9 Claims, 21 Drawing Sheets

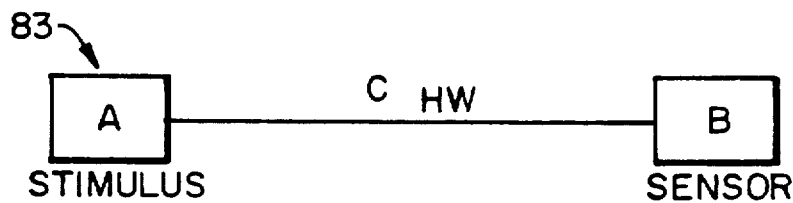
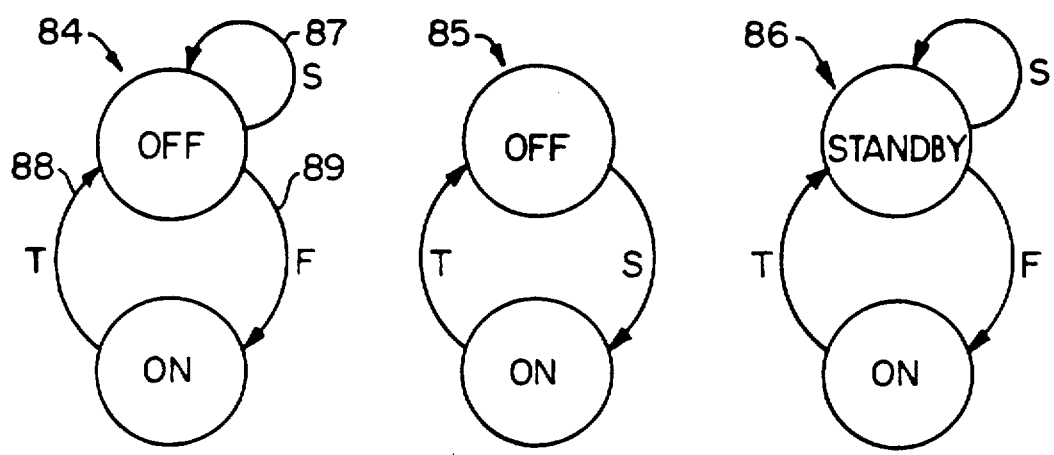
FIG.3.

Order of Execution

```
fg.setup(20e6,1.0,50,0.0);                          /* Set up instruments      */
ps.setup(15,15,0.5,0.5);
scope.setup(1,0,0.002,3,-3,POS,INT);

sPath.setup(fg.out(sigOut),dut.in(sigIn));          /* Make signal paths       */
sPath.setup(ps.out(power),dut.in(power));
sPath.setup(dut.out(tp8),scope.in(ch1In));

ps.function                                         /* Turn on power           */
sPath.function(ps.out(power),dut.in(power));        /* (animate signal path)   */ fg.function;                                        /* Turn on signal          */
sPath.function(fg.out(sigOut),dut.in(sigIn));       /* (animate signal path)   */
sPath.function(dut.out(tp80,scope.in(ch1In));       /* (animate signal path)   */ scope.function;                                     /* Digitize signal         */ fg.termination;                                     /* Turn off signal         */ sPath.termination(dut.out(tp80,scope.in(ch1In));    /* Break DUT/Scope path    */ sPath.termination(fg.out(sigOut),dut.in(sigIn));    /* Break FG/DUT path       */
ps.termination;                                     /* Turn off power          */ sPath.termination(ps.out(power),dut.in(power));     /* Break PS/DUT path       */
```

FIG.21.

METHOD OF GENERATING INSTRUCTION SEQUENCES FOR CONTROLLING DATA FLOW PROCESSES

This is a continuation of application Ser. No. 206,649, filed Jun. 14, 1988 and now abandoned.

RELATED APPLICATION DATA

This application is related to U.S. Pat. No. 4,868,785 entitled BLOCK DIAGRAM EDITOR SYSTEM AND METHOD FOR CONTROLLING ELECTRONIC INSTRUMENTS, issued Sep. 19, 1989 to Jordan and Stubbs, et al.; and to U.S. Pat. No. 4,812,996 entitled SIGNAL VIEWING INSTRUMENTATION CONTROL SYSTEM, issued Mar. 14, 1989 to Stubbs.

BACKGROUND OF THE INVENTION

Field of the Invention

The present invention relates to computer control of electronic test and measurement systems and, more particularly, includes methods and apparatus for generating properly interleaved software to implement a system of multi-state resources topologically interconnected to perform a data flow process, and methods of executing the software.

Data Flow Systems

Electronic instruments and other devices may conveniently be modeled and controlled with the use of computers. For example, interactive control of a measurement instrument may be accomplished through a graphic user interface designed to eliminate direct sequential manipulation of, and obviate detailed familiarity with, the front panel of the instrument.

Test and measurement systems typically comprise a stimulus device, a device under test (DUT), and a measurement instrument for measuring the response of the DUT to the stimulus. A system of this type may conveniently be modeled and controlled using a block diagram editor and electronic instrument control system designed for this purpose, as described in the above-referenced U.S. Pat. Nos. 4,812,996 and 4,868,785.

Simple topologies are conveniently modeled, in a steady state, using conventional sequential control-flow programming techniques. Thus, the automated control of individual instruments, or test setups including several instruments or devices, usually begins with all physical connections in place, power applied, devices warmed up (i.e., at steady state), and the system generally ready to begin capturing data.

The concurrency of operation of electronic system components also is usefully modeled, and their simulation and control effectively programmed, using data flow systems. Data flow systems are characterized in pertinent part by (1) data-activated, asynchronous executions of operations; (2) operands consumed by operators; and (3) the absence of internal state or explicit storage. See Hughes, J. "A High-Level Representation for Implementing Control-Flow Structures in Dataflow Programs," Center for Reliable Computing, Computer Systems Laboratory, Stanford University (CSL Technical Report No. 82-4, May, 1982).

Data flow diagrams can be understood as programs. In these diagrams, blocks represent functions performed on data and connections represent the transmission of data between the functions. When the resources in a data flow diagram represent only computer-based transformations or transmissions of data, a simple rule determines when each can run: upstream resources function before downstream resources. For example, in performing simulations, it may be assumed that all functions are in a steady state, ready to operate in response to inputs.

Multi-state Resources

The simple rule is inadequate when resources represent external devices that have multiple states such as test instruments, devices-under-test, or physical signal paths. For example, a power supply can be off or on. A signal path can be made or broken.

When resources can be in different states, their states must change to perform the computation expressed in the program. Continuing the instrumentation example, each physical device should be in a quiescent, or safe state when not in use. When the computation or measurement is completed, the device should be returned to the safe state.

In a data flow diagram, for instance, that shows "data" (a physical signal) flowing from a power supply to some other physical (e.g., measurement) device, the power supply must be turned on and remain on while the next (i.e., "downstream") device performs its function. These kinds of relationships among state changes in resources are termed "dependencies." The power supply can be turned off only when all of the downstream functions that depend on the power supply signal have completed their functions. Likewise, the signal path between the power supply and the next device must be made before the signal is applied and broken only after it has been removed. Thus, execution of a power supply block (i.e., function) could have two parts (or state-changing "tasks"): turning it on and turning it off. A physical connection function also has two related tasks: making the path and breaking it. Finally, the measurement device, such as a multimeter, may require set-up, such as selecting an appropriate range of measurement, before it properly can "function," i.e., measure the signal. This state change, from a quiescent or standby mode to an active "measure" mode, is particularly important to protect the measurement device from out-of-range inputs.

Programmers implementing data flow diagrams using conventional, text-based programming languages (e.g., BASIC, C, Pascal, etc.) not only must identify the relevant tasks and dependencies, but also must order the tasks in a strictly linear way. Most data flow programming systems have been implemented to support parallel computation of numeric algorithms (e.g., digital signal processing) (Dennis, J. B., Broy, M., "Control Flow and Data Flow: Concepts of Distributed Programming," Proceedings of NATO Advanced Study Institute International Summer School, Marktoberdorf, Germany, 1984, at 345-98.) and do not address resources having multiple states. In these systems, the simple ordering rule is sufficient. Other Products "LabVIEW" is a graphic, interactive test and measurement instrument control product available from National Instruments. In LabVIEW, "virtual instruments" are created and stored to repeatedly look up and program machine-specific mnemonics for instrument control.

Using the "frame" concept in LabVIEW, programmers create multiple diagrams that explicitly implement each resource's state changes and interleave these diagrams within the frame structure. The frame structure provides sequential execution of the individual data flow diagrams thus achieving the proper state change sequence. This technique prevents programmers from using a single data flow block to represent a multiple-state resource in cases where the resource's state changes must be interleaved with those of other resources.

Signal processing simulation software entitled "Signal Processing WorkSystem" (SPW) provides data paths for control tokens and logic components (e.g., counter, AND, OR, NOT, etc.) to control their flow. (See *Signal Processing WorkSystem TM Technical Backgrounder*, Tektronix CAE Systems Division, 1987). All blocks in SPW, including instrument blocks, can be built with control token inputs and outputs. Programmers must explicitly connect control logic to processing blocks to achieve proper ordering of block functions, as well as make connections representing data flow. Each time a block executes, it behaves according to the pattern of externally-applied control information.

Present Need

The need remains for a method and apparatus for creating programs in which single blocks can represent multiple state resources that, upon execution, automatically will perform their state changes in a properly interleaved order, obviating the need to provide control logic or to split and interleave tasks manually.

SUMMARY OF THE INVENTION

Overview

An object of the present invention is to implicitly order tasks in a computer controlled test and measurement system so that users need not explicitly do so. Another object of the invention is to automatically generate an executable sequence of computer instructions to control a system of resources topologically interconnected and operable to implement a dataflow process. Yet another object of the present invention is to protect the input circuitry of sensitive measurement instruments used in computer-controlled test and measurement systems. An additional object of the invention is to automatically control a test system so as to ensure that collected data is valid.

The present invention provides a method of automatically generating a sequence of computer instructions to control a system of resources topologically interconnected and operable to implement a data flow process. The resources include blocks and connections. The system of resources may conveniently be represented as a block diagram and, preferably, created and manipulated as disclosed in the above-referenced co-pending patents.

The method includes providing a computer system including prestored code blocks or drivers for implementing the resources. A user inputs into the computer system data defining a desired data flow process, the data including an identification of each resource used in the process and the topological interconnection of the resources used in the process.

For each code block corresponding to a resource used in the process, instructions for implementing each of a set of tasks are identified, as well as a portion of the code block associated with each task. For an electronic test and measurement system, as well as many other systems, the set of tasks associated with a given resource can include no task, or one or more of the tasks: Set-up, Function and Terminate.

The tasks thus identified are ordered or positioned in accordance with the topological interconnection of the resources and in accordance with a predetermined set of task-positioning rules to form a network of dependencies among the tasks. The resulting network is an acyclic graph. It may be represented pictorially, as shown e.g. in FIG. 12. The network is used to generate code for controlling the data flow process as more fully explained below.

General Task-Positioning Rules

For many systems, the tasks can be suitably ordered by application of a predetermined set of general task-positioning rules. The task positioning rules in their simplest form include the following internal task positioning rules:

Set-up precedes Function;
Function precedes Terminate; and
Set-up precedes Terminate (if no Function task).

These rules determine the order of execution of a single resource's tasks. An order of execution of tasks relative to the tasks of other resources is determined by external task-positioning rules. A set of such rules is as follows:

downstream block's Set-up precedes upstream blocks' Function;
downstream block's Function follows upstream blocks' Function;
downstream block's Terminate follows upstream blocks' Terminate;
connection's Set-up precedes upstream block's Function;
connection's Function follows upstream block's Function; and
connection's Terminate follows upstream block's Terminate.

Refined Task-Positioning Rules

More complex positioning rules may be required to properly order tasks in networks having certain combinations of resources and topology. For example, Appendix A includes a refined set of rules which distinguish among different types of connections (hardware and software) and distinguish among types of inputs (software inputs, hardware inputs and parameter inputs). The refined rule list shown in Appendix A subsumes the general rules set forth above.

Input Ordering Restrictions

The invention further provides for properly interleaving tasks for systems in which one or more resources has multiple inputs and the sequence of applying and/or removing input signals is restricted. For example, a device (or resource) may have a power supply input and a signal input. Power must be applied to the power supply input before a signal is applied to the signal input.

In systems that require them, input ordering restrictions can be included in the prestored code block for implementing the resource, or may be specified as part of data defining the requirements of a particular block. General rules are provided for implementing such restrictions. Application of these rules to the input ordering restrictions defines additional dependencies among tasks, thereby affecting the resulting sorted list of tasks. Ordering rules are provided for enforcing separate restrictions on data application and signal application and/or removal.

Data Structures

In a preferred embodiment, hierarchic data structures are provided for representing in the computer a block diagram representative of a data flow process. At its highest level, the data structure includes an object called BlockDiagram having variables including a list of the block diagram's blocks, a list of the block diagram's connections, and an empty structure called "sortList" to be filled in with an ordered list of the tasks of the block diagram.

Each block data structure in turn has associated data structures including a list of inputs and outputs and a list of the block's associated tasks. Proceeding down the hierarchy, each task has data structures including a component for identifying the associated block, an object identifying the type of task, a list of predecessor tasks, a reference count, and a list of successor tasks. The last three structures are empty prior to carrying out the task ordering procedure.

Application of the ordering rules defines a number of dependencies among the tasks. Each such dependency, for example, that a first task precedes a second task, results in the first task being added to the second task's list of predecessors and, conversely, the second task being added to the first task's list of successors. The reference count is the number of predecessors. Thus, it is incremented for each predecessor added to the list. The foregoing data structures facilitate sorting the tasks to produce a partially ordered list for execution or code transmission as further explained in the next section.

Methods of Execution

Code blocks corresponding to the identified tasks can be executed to carry out the process on a physical system modeled by the data flow. The preferred embodiment includes screen "animation" such that resources in a data flow diagram are highlighted when their underlying software is executed.

The list of tasks and their dependencies can be used to link the instructions or drivers together in a proper sequence for executing the tasks. The identified tasks are executed using either of two techniques, a linearization technique and/or multiprocessing technique.

In the linearization execution technique, the network of dependencies is partially ordered by a technique called "topological sorting." (Knuth, Donald E., *Fundamental Algorithms*, Addison-Wesley, 1973, Page 258.) The sorting procedure produces a sequence of lists of tasks called "interior lists." Each interior list is considered in order. (See text below describing FIG. 14.) Within each interior list, the tasks are executed sequentially in any order. Their execution changes the state of the resources, often producing data for their successor tasks. The resulting order of execution is one of many that assure correct execution of the data flow program.

The corresponding sequence of code may be executed directly to control the data flow process in an integrated system, i.e., one including both a computer programmed with block diagram editor software and data flow-to-sequential conversion software (as disclosed herein) and apparatus for controlling the physical data flow process. Alternatively, source code in any convenient language may be generated by known techniques and ported to another computer. The generated code may be written to a portable storage medium, such as magnetic tape or floppy disk, for subsequent execution on a target system. For example, a target system may be a computer-controlled manufacturing test facility located at a manufacturing site where product (DUT) testing is required.

The target system may be a relatively simple and inexpensive one, as it need only have the capabilities of interfacing with the physical resources and executing the code. It need have only a single process operating system, for example, MS DOS (TM), to execute the linear code. The target system need not have the interactive graphics capabilities of the block diagram editor, nor the other elements included in a system adapted for implementing the present invention.

The invention includes use of an alternative execution technique on systems having multiprocessing capability, in which linearization is unnecessary. The multiprocessing execution may be carried out directly in an integrated multiprocessor system, as above. Alternatively, appropriate code may be generated for subsequent execution on a target machine having a multiprocessing operating system.

In the multiprocessing technique, each task is made into a standard operating system process. Upon execution, these processes are linked using some operating system message-passing system (e.g., semaphores) according to the dependencies. Processes that do not depend on others (i.e. those having no predecessors), the root processes, (i.e., no predecessors) are executed. As they complete, they signal their successors. When a waiting process has been signaled by all the upstream processes on which it depends, the waiting process then executes. The program is completed when no process remains to be executed.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 3 is a second illustrative data flow diagram and corresponding state diagrams and resource table.

FIG. 21 is a C++ listing, with comments in italics, of code for executing the data flow diagram of FIG. 15 based on the sorted task list of FIG. 20.

APPENDIX A is a list of task-positioning rules incorporated in a preferred embodiment of the invention including Smalltalk-80 (TM) code segments implementing each rule. References such as "R1", "R6" etc. in the FIGURES refer to the corresponding rules set forth in Appendix A. The number following the R refers to the numbering used in Appendix A.

Appendix B is a list of selected segments of Smalltalk-80 (TM) code incorporated in a preferred embodiment of the invention including comments describing the operation of each code segment. The appendices form a part of this disclosure.

DETAILED DESCRIPTION

State-changing and Data Producing Tasks

Figure 1:
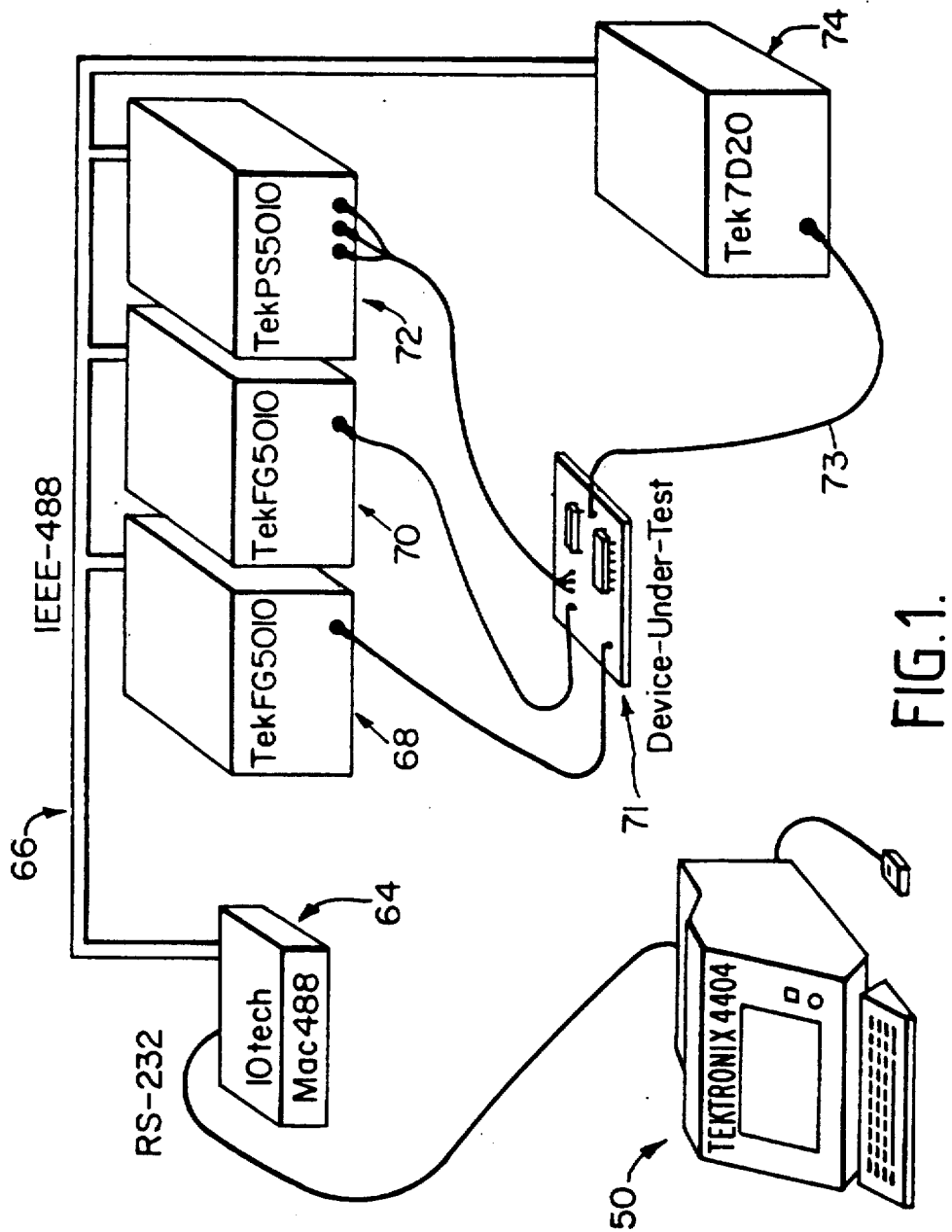
FIG. 1 is a diagram of an example of a computer-controlled electronic test system in which the invention is embodied.

FIG. 1 depicts a diagram of a system for testing a device-under-test 71 under computer control. The diagram shows the layout and interconnection of a computer and programmable test instrumentation system for stimulating the device-under-test (DUT) 71, such as an AM modulator, and detecting and analyzing the response.

The system depicted in FIG. 1 includes a computer system 50; protocol converter 64 for connecting the computer system to an interface bus 66 (IEEE-488); three signal generating instruments 68, 70 and 72, all connected to the bus 66; the DUT 71 connected to receive stimuli from the signal generating instruments; and a measurement instrument 74, connected via connection 73 to receive a signal of interest from the DUT and connected to the bus 66 to communicate with the computer system 50. The computer system 50 of FIG. 1 includes block diagram editor software for creating and editing block diagrams representing data flow, or simply "data flow diagrams." This hardware and software are described in detail in U.S. Pat. No. 4,868,875.

Figure 2A:
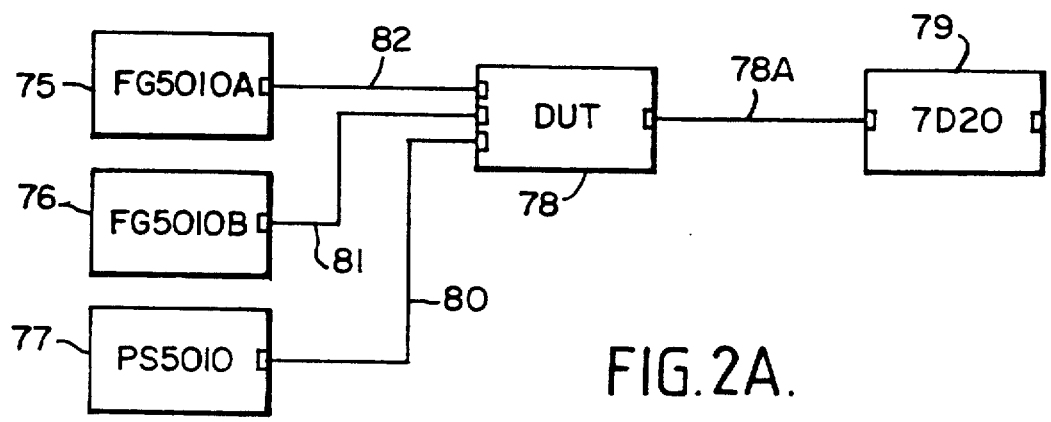
FIG. 2A is a first illustrative data flow diagram created using a block diagram editor for computer-controlled implementation of a data flow process in the test system of FIG. 1.

FIG. 2A illustrates a display screen image generated by the computer system 50 including a data flow diagram corresponding to the test system shown in FIG. 1. The diagram is created using the block diagram editor system described in Jordan and Stubbs, et al, Ser. No. 07/007,234, and provides the user an interactive means for controlling a hardware system such as that of FIG. 1.

Referring to FIG. 2A, each instrument, or "resource", is represented by a block. Blocks 75, 76 and 77 correspond to the signal generators 68, 70 and 72, respectively in FIG. 1. Block 78 corresponds to the DUT 71 in FIG. 1, and block 79 represents the measurement instrument 74 in FIG. 1.

Additionally, each physical connection between resources is itself a resource. Thus, connections 80, 81, 82 and 78A are resources. In summary, the data flow diagram shown in FIG. 2A shows a set of resources topologically interconnected to model the test system of FIG. 1. The resources (signal generator blocks 75, 76 and 77) generate data to stimulate the DUT block 78; transmit data (connections 80, 81, 82 and 78A); respond to data (DUT block 78); and sense data (measurement instrument block 79).

Figure 2B:
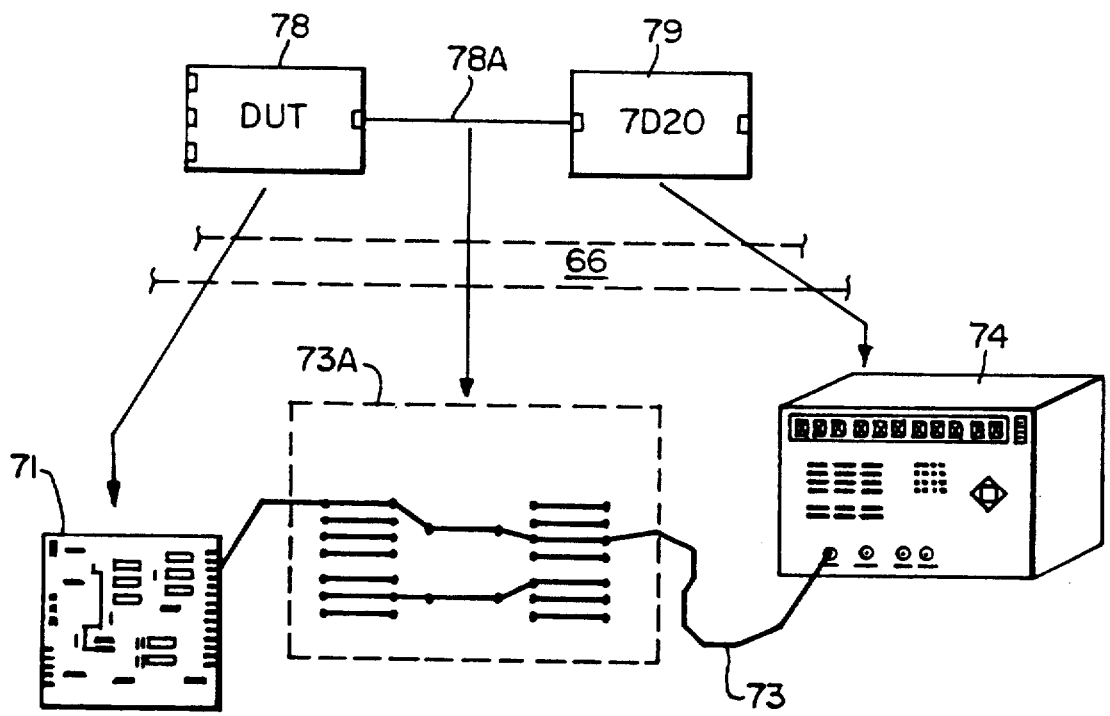
FIG. 2B is a diagram illustrating the conceptual relationship between a selected portion of the physical test system of FIG. 1 and its corresponding data flow diagram representation.

FIG. 2B shows the relationship between three of the physical elements of the test system of FIG. 1, and its virtual implementation as a network of blocks and connections in a system according to the present invention. The physical DUT 71 is represented by block 78. The physical connection 73 from the output of the DUT to the measurement instrument 74, which may included a switch matrix indicated by dashed box 73A, is represented by connection 78A in the virtual implementation. Finally, the physical measurement instrument 74 is represented by block 79. The computer system provides the user interactive control of the physical devices, over the GPIB bus 66, through the medium of the blocks and connections.

"Tasks" are operations which change the state of a resource or cause it to generate data. Though any number of task types may be identified, three types or classes of tasks are sufficient for common instrument control situations. These three tasks are denominated "Set-up," "Function," and "Terminate. The classes are defined generally as follows:

Set-up: A Set-up task uses parameters to prepare a resource to function, placing it in a state ready to produce an output, or ready for the arrival of data (including physical signals).

In a system with test instruments, for example, blocks representing measurement devices usually have Set-up tasks.

Function: A Function task produces output data, transforms input data making output data available, or consumes input data to produce some external effect, for example, producing a display, writing to a file, or printing a report. Stated differently, the function task drives a resource from a quiescent, standby state to an active, functioning state.

A resource might not have a function task where it has no way of controlling its output. This is the case where an input signal is applied and an output signal is immediately present, as across a resistor.

Terminate: A Terminate task makes an output physical signal unavailable, disconnects a resource from an input signal, or returns a resource to a quiescent, ready, or safe state.

In many test and measurement systems, resources representing external, physical devices often require a combination of tasks. In effect, these tasks drive the physical device through state transitions taking it from a quiescent or safe state to an active, functioning state, and then back. Other types of resources may require no tasks at all because they have but one state. An example is a passive electronic component such as a resistor. Typical task combinations and representative examples include:

<no tasks> (passive device, e.g., filter)
Set-up (programmable passive device, e.g., programmable filter bank)
Set-up, Function (measurement device, e.g., multimeter, digitizer).
Set-up, Terminate (physical connection, e.g., switch matrix)
Function (simple software function, e.g., fft, add)
Set-up, Function, Terminate (device that can control its input, e.g., digitizer with input coupling)

Simple Illustration of Data Flow Diagram

Application of the concept of Tasks is illustrated in the following simple example. FIG. 3 depicts a second illustrative data flow diagram 83 consisting of Stimulus Block A connected to a Sensor B by a physical Connection C. The stimulus A, such as a signal generator, may be in either of two states, ON or OFF. This is represented by a state diagram 84 shown below block A in FIG. 3, in which the letter S stands for Set-up, F for Function and T for Terminate.

Block A accordingly has associated with it a set of tasks including Set-up, Function and Terminate. Set-up generally is conducted with the device in an off or quiescent state and does not change that state, as indicated by arrow 87. Set-up may include setting parameters such as the output voltage swing or waveform to be generated. In test systems such as that described in Jordan, et al, these parameters may be set through a graphic interface. Block A's Function task, indicated by arrow 89, takes the signal generator from the OFF state to the ON state, i.e. an active state where the signal generated by A is present at its output. Finally, the Terminate task, indicated by arrow 88, changes the device from the ON state to the OFF state.

The hardware connection C has two states, it simply is made or broken. It may be considered ON when the connection is made, i.e. an electrically conductive path is established between its input and its output, and OFF when the connection is broken. The Set-up task changes the state of connection from OFF to ON and the Terminate tasks changes it from ON to OFF again. These state changes are illustrated in state diagram 85 in FIG. 3.

Finally, the sensor B, e.g., a measurement device, has a standby or quiescent state and a functioning or active state. Its parameters are set up during the standby or quiescent state. In the active state, it measures the signal at its input and generates data. This sequence is important to avoid abusing the instrument by changing measurement parameters while an upstream device is applying a signal. Once the device is set up, the Function task changes it to ON or active state and the Terminate task returns it to standby state. These state changes are indicated in state diagram 86, shown below the sensor B in FIG. 3.

GENERAL RULES FOR ORDERING TASKS

Ordering the tasks with respect to an individual resource is determined according to the following general internal task-positioning rules:

Set up precedes Function;
Function precedes Terminate; and
Set up precedes Terminate (if no Function task).

Identification of these rules is essential to the "interleaving" of different resources' tasks. Interleaving refers to an ordering among all of the tasks associated with a data flow system (for example, among the 7 tasks shown in Table 90 in FIG. 3). The interleaving is accomplished in accordance with the internal task-positioning rules set forth above and, additionally, for each resource relative to another in accordance with the following general external task-positioning rules:

Downstream block's Set-up precedes upstream blocks' Function.
Downstream block's Function follows upstream blocks' Function.
Downstream block's Terminate follows upstream blocks' Terminate.
Connection's set up precedes upstream block's Function.
Connection's Function follows upstream block's Function.
Connection's Terminate follows upstream block's Terminate.
Downstream Block's Function precedes upstream Block's Terminate.

More complex rules may be required depending on the nature of the resources and tasks involved. Refined rules are set forth below and in APPENDIX A. First, however, application of the general rules to the example of FIG. 3 is described.

APPLICATION OF THE GENERAL RULES

Referring to FIG. 3, assume that the stimulus (Block A) is a signal generator and that the sensor (Block B) is a digital multimeter (DMM). The signal generator is a physical resource having associated tasks Set-up; Function and Terminate. The DMM is a physical resource having associated tasks Set-up and Function. The connection C, as noted above, is a physical connection, having associated tasks Set-up and Terminate.

Resource table 90 in FIG. 3 summarizes the three resources A, B and C comprising the data flow diagram 83 and their respective tasks. In the resource table 90, each resource is listed in a first column 92, each resource is identified in a second column 94, and the respective tasks associated with each resource are abbreviated in a third column 96. In column 96 (and in FIGS. 3-7), the abbreviation "s" stands for Set-up, "f" stands for Function, and "t" refers to Terminate.

Figure 4:
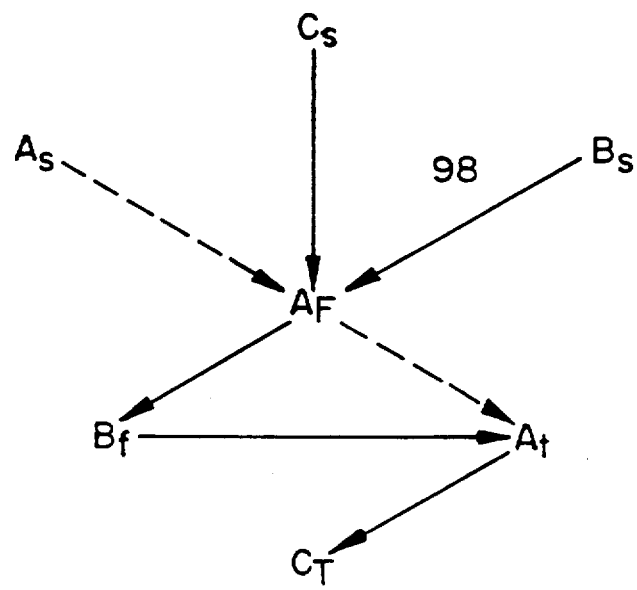
FIG. 4 is a diagram of the dependencies resulting from application of the general task-positioning rules to the tasks associated with the data flow process of FIG. 3.

Referring now to FIG. 4, the collection of tasks to be interleaved to implement the data flow of FIG. 3 are shown randomly arranged on the page. Lines are drawn between the tasks showing dependencies in accordance with the general rules set forth above. The solid lines are dependencies arising from general external positioning rules. The dashed lines show examples of dependencies arising from the general internal positioning rules. The dependency lines terminate in arrowheads which indicate the sequence of control flow prescribed by the rules.

To illustrate, the first general external rule set forth above is, "Downstream block's Set-up precedes upstream blocks' Function." Referring to FIG. 3, B is the downstream block and A is the upstream block. Application of this rule requires that B's Set-up task precede A's Function task. Physically, this means that the DMM must be set up, i.e., set to an appropriate range, before the signal generator functions, i.e., produces a signal. This restriction protects the DMM input circuitry. This requirement is modeled as a dependency represented by line 98.

Figure 5:
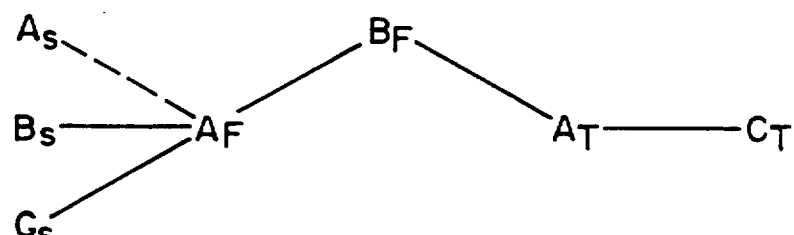
FIG. 5 is a directed, acyclic graph (DAG) of the tasks of the data flow diagram of FIG. 3 ordered in accordance with the dependencies shown in FIG. 4.

FIG. 5 shows a sorted, directed graph of the tasks and dependencies of FIG. 4 in which control flows from left to right. It illustrates pictorially a partially ordered list of tasks for execution, discussed below. The tasks are properly interleaved to protect the test instrument and produce valid measurement data.

APPLICATION OF A REFINED RULE LIST

Figure 6:
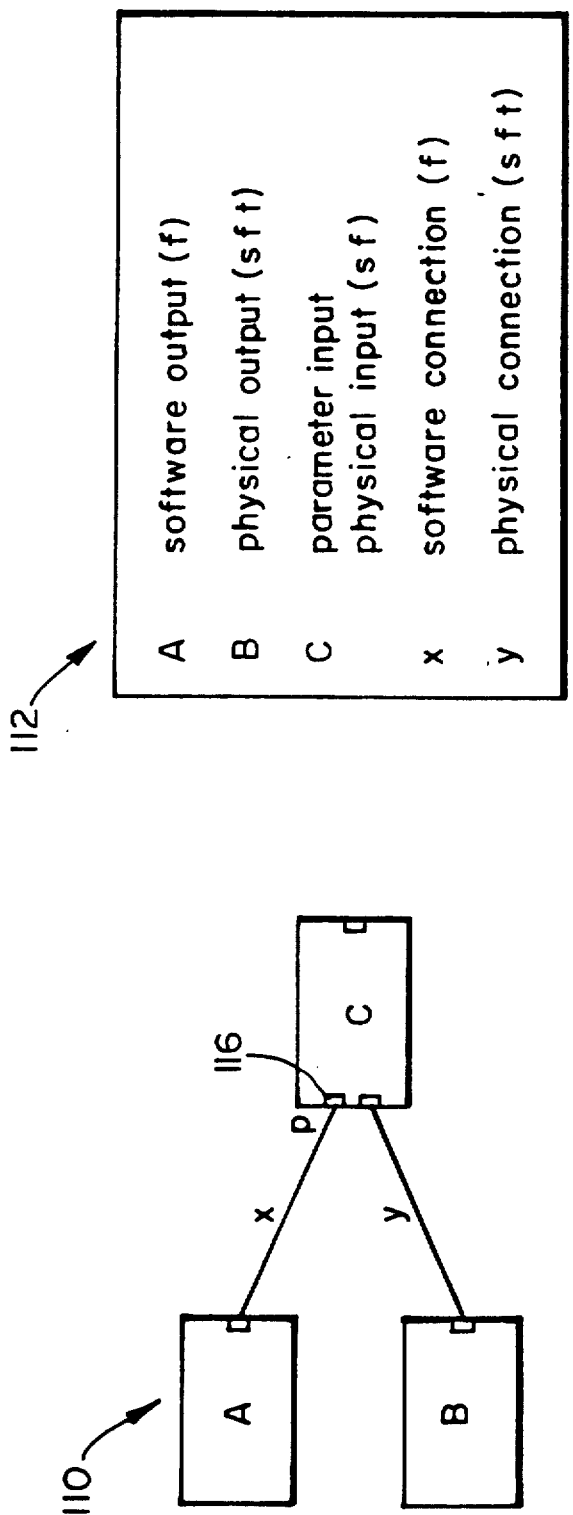
FIG. 6 is a third illustrative data flow diagram and corresponding resource table.
Figure 7:
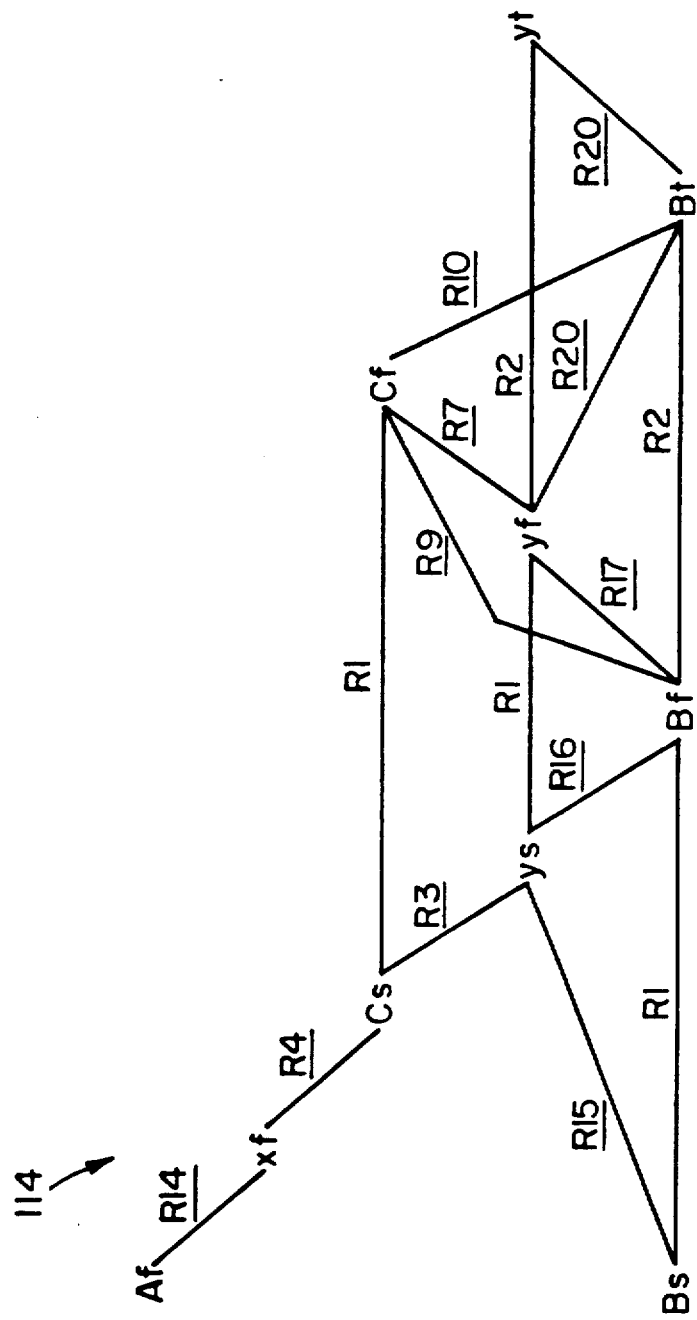
FIG. 7 is an unsorted diagram of the tasks associated with the data flow of FIG. 6 and the dependencies among those tasks.

FIG. 6 depicts a third data flow diagram 110 and corresponding resource table 112. Specifically, the data flow diagram 110 includes three resource blocks, labeled A, B, and C respectively, and interconnections x and y. The resource table 112 sets forth the specific nature of the resources comprising the diagram and their respective tasks, shown within parentheses. Note the presence of a software connection x between resource A and a first input 116 to resource C. The letter p adjacent the input 116 designates a parameter input. A hardware or physical connection y connects resource B to resource C.

This example is typical of many test and instrumentation applications. Such applications often include a device producing a physical output, such as a device-under-test, shown here as resource B. Resource C may be a measurement or data acquisition instrument, such as a programmable multimeter. The multimeter has two inputs, the signal to be measured, produced by resource B and provided to the multimeter via physical connection y, and a parameter input which is provided over software connection X from a driver A in the computer system. The parameter might be, for example, range or sensitivity selection.

In FIG. 6, C is downstream of both resources A and B. Application of the general rule "downstream block's Set-up precedes upstream block's Function," to resources C and A would have the DMM Set-up before the Set-up parameter is available, i.e., before upstream block A functions. This is plainly incorrect. It illustrates that the basic general rules set forth above are insufficient to properly order and interleave the tasks of the data flow represented by diagram 110. The general rules fail to account for this type of network where a resource, in this case C, must have a parameter provided in order to perform its Set-up task.

Referring now to Appendix A, note that rule 4 of the refined rule list applies to this system. It provides, "A block's Set-up task follows software connections' Function [tasks] upstream of parameter inputs." Referring now to FIG. 7, the directed graph 114 includes the tasks of data flow diagram 110 properly ordered in accordance with the refined rule list. The rule number which dictates each dependency is indicated with an R adjacent the line indicating that dependency. In particular, note that $A_f$(A's Function, i.e., providing the parameter to Set-up C) precedes $C_s$ (C's Set-up), in accordance with the quoted rule.

In a preferred embodiment, all positioning rules are applied (if they can be applied) to every data flow diagram. This results in redundant dependencies on occasion, but they cause no harm in practice and allowing them obviates substantial additional code necessary to identify and remove such redundant dependencies.

The DAG 114 illustrates the resulting partially ordered list of tasks. The code segments corresponding to the tasks are linked sequentially in accordance with the list. The resulting code may be written to a file or compiled for execution.

ILLUSTRATIVE DATA STRUCTURES

FIGS. 8-20 include illustrative data structures for implementing the present invention in an object-oriented programming environment. The description proceeds through the use of two illustrative data flow block diagrams, shown in FIG. 8 and FIG. 15. FIGS. 8-14 illustrate a preferred implementation of the invention in a simple software example by means of hierarchic data structures. FIGS. 15-21 extend the principles of the invention to input ordering in an example of a test system.

Figure 8:
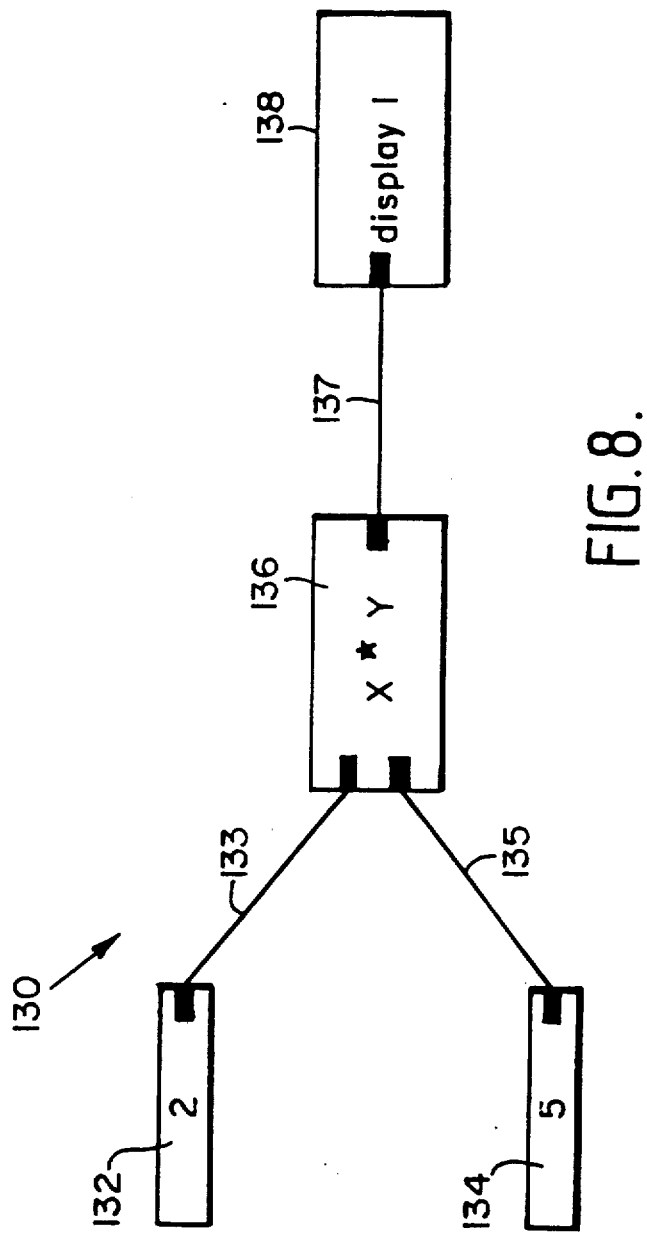
FIG. 8 is a fourth illustrative data flow diagram depicting a system which is implemented solely in software to display the product of two numbers.

Referring first to FIG. 8, a fourth illustrative data flow block diagram 130 shows a data flow system which may be implemented in software exclusively. This data flow system multiplies two constants, 2 and 5, and displays the resulting product. The diagram consists of blocks 132, 134, 136 and 138 and connections 133, 135 and 137.

Figure 9:
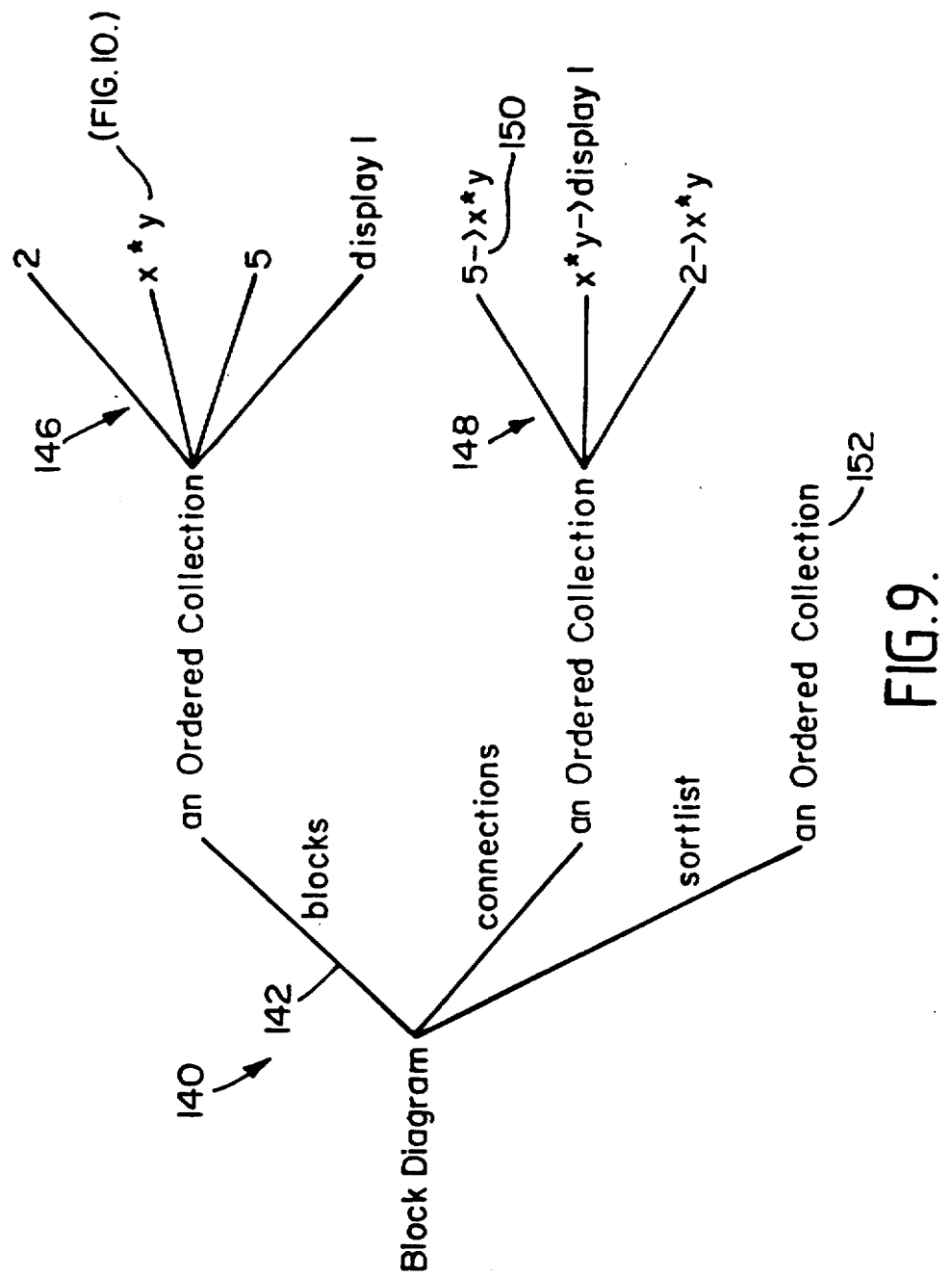
FIG. 9 is a diagram of a portion of the data structure associated with the block diagram of FIG. 8.

FIG. 9 shows the data structure of the block diagram of FIG. 8. Here and in subsequent data structure illustrations, angled lines such as line 142 in FIG. 9 illustrate the hierarchic relationship from one data structure to a descendent data structure, generally shown to the right of its parent. The data structure 140 of the block diagram includes a list of blocks which is itself an ordered collection, a list of connections which is also an ordered collection and an empty list of sorted tasks, also an ordered collection, here labeled "sortList." In Smalltalk-80 ® parlance (Smalltalk-80 is a registered trademark of Xerox Corporation), the foregoing three lists or ordered collections are the instance variables of the object BlockDiagram.

Proceeding further down the hierarchy shown in FIG. 9, the ordered collection which is a list of blocks contains entries 146 which represent the four blocks shown in FIG. 8. Referring now to the lower right portion of FIG. 9, the contents of the connections list shown by lines 148 include the three connections shown in the block diagram in FIG. 8. Here, an arrow, shown between the names of two blocks, for example, arrow 150, designates a connection between those two blocks with the direction of the arrow indicating the direction of data flow. The data structure shown as FIG. 9 is provided by a block diagram editor, similar to that described in U.S. Pat. No. 4,868,875. The ordered collection 152 designated "sortList," a list of tasks sorted into an appropriate sequence, will be filled in preparation for execution of the data flow diagram, as further explained below.

Figure 10:
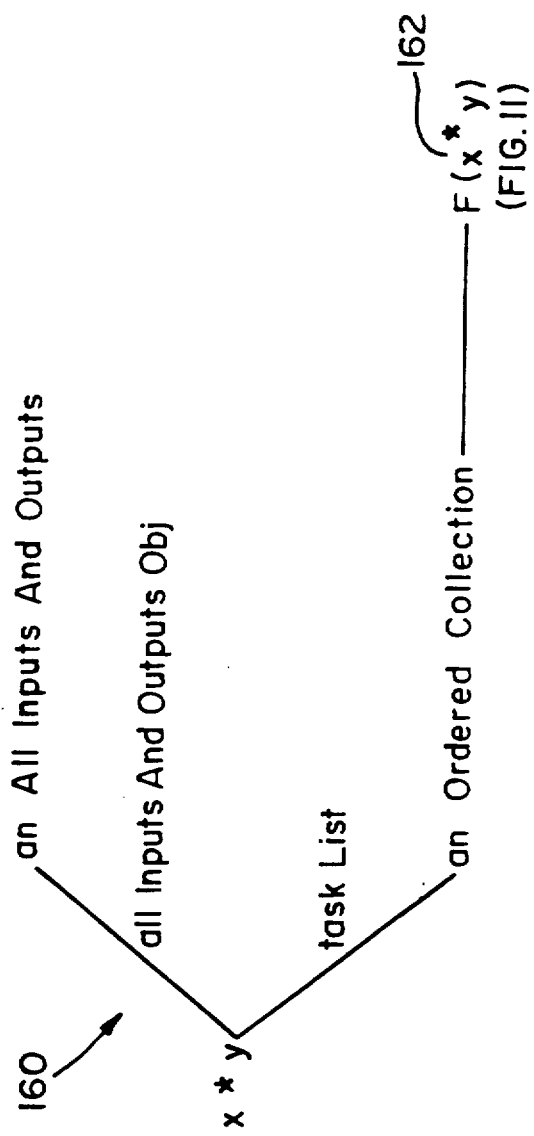
FIG. 10 is a diagram of a portion of the data structure of the multiply block of FIG. 8.

FIG. 10 shows additional detail of a block's data structure. For example, the multiply block's (x * y) data structure 160 variables includes a list of the block's tasks, "taskList", and an object containing a list of all of the inputs and outputs of the block, in this case designated allInputsAndOutputsObj. The taskList, in this example, contains only one task, a Function task 162, designated "F(x * y)" in the diagram. Because the multiplier block is implemented in software, Function is the only task associated with it.

Figure 11:
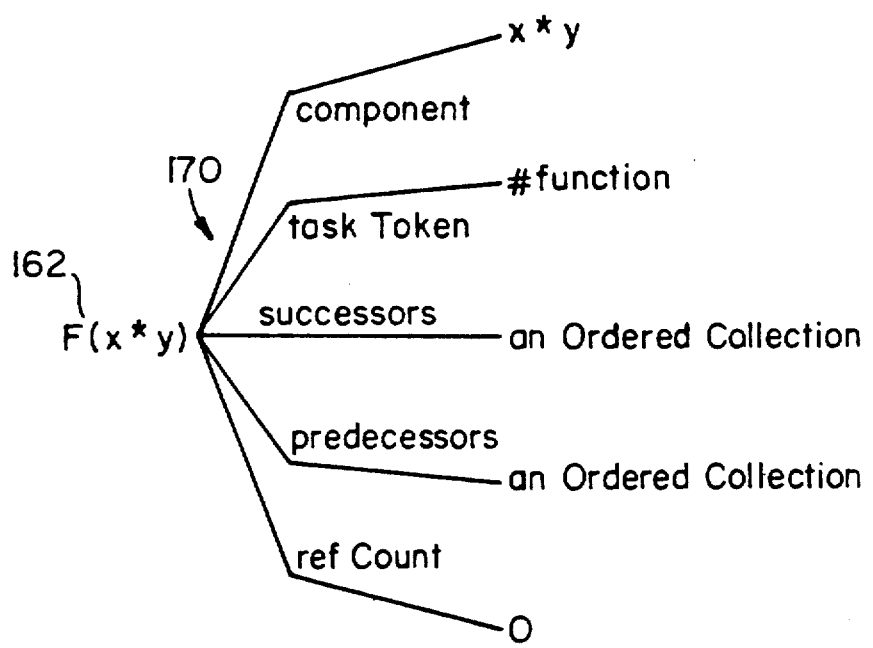
FIG. 11 is a diagram of the data structure of the Function task of the multiply block of FIG. 8.

Referring now to FIG. 11, Function task 162 itself has a data structure 170 which includes five instance variables. First, a component, which identifies the block to which the task belongs, in this case the x * y multiply block. Second, a task token, here designated "task-Token," is provided which the task sends to its component block at execution time telling it what code block to execute, in this case the code for implementing the multiply block's Function task. The task does not itself perform the multiply, but merely signals its parent block, the multiply block, with its task token (#function) to generate an output equal to the product of its inputs. Third, Function task 162 data structure includes an ordered collection called "successors" which will be filled with tasks which must follow the present task. Fourth, an ordered collection called "predecessors," which will be filled with tasks which must precede the present task; and fifth, a variable called "refCount," which will contain the number of predecessor tasks, are provided.

Figure 12:
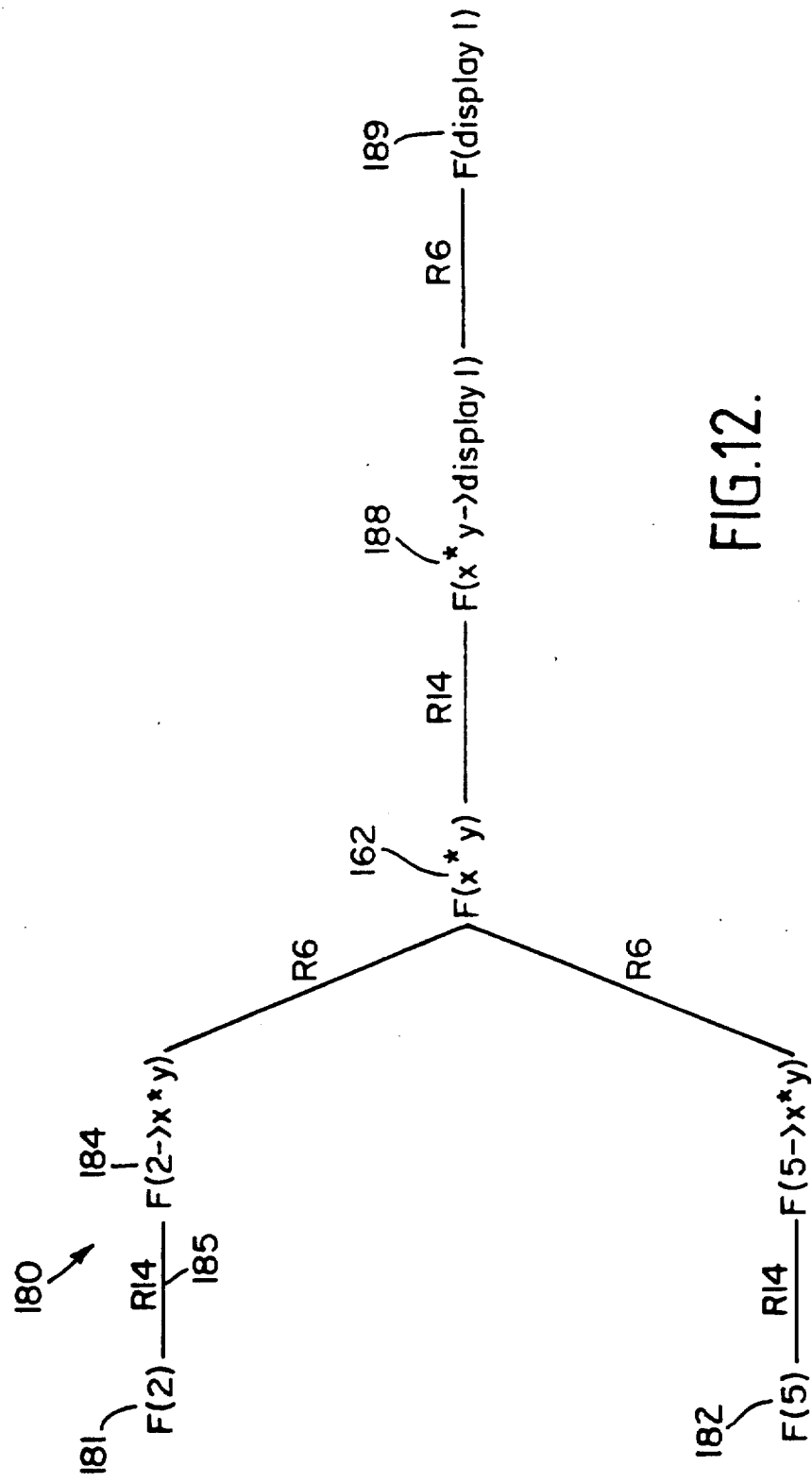
FIG. 12 is a network of tasks of the data flow of FIG. 8 as related by the applicable ordering rules shown in Appendix A.

FIG. 12 shows a network of tasks 180 of the data flow diagram FIG. 8 related by the applicable ordering rules shown in Appendix A. To illustrate, referring to the upper left of the diagram, the Function task 181, represented by the symbol F(2), is the Function task of the block 132 labeled 2, which represents a constant generator for producing the value 2. That block has no Set-up task, and upon executing its Function task, it generates its output, namely the constant 2.

The next task downstream in FIG. 12 is the Function task 184 of the connection 133 which connects the constant generator 132 to the multiplier block 136 (FIG. 8). The dependency line 185 interconnecting these two blocks in the network is labeled "R14," signifying the rule (Rule No. 14) listed in Appendix A which requires this dependency. Thus, according to Rule 14, "A connection's Function task follows upstream block's Function."

The remaining tasks associated with the block diagram of FIG. 8 are shown in the network in FIG. 12, as related by the applicable rules. Note, for example, that both of the constant number generators (2 and 5) and their connections to the multiplier block must function before the multiplier block may Function (task 162). Thus, both multiplier and multiplicand must be present before the multiplication is executed in order to produce a valid result. Similarly, FIG. 12 reflects the requirements that the product thus produced be valid and the connection from that product to the display must function (task 188) before the display functions (task 189). This ensures that the information displayed is valid.

Figure 13:
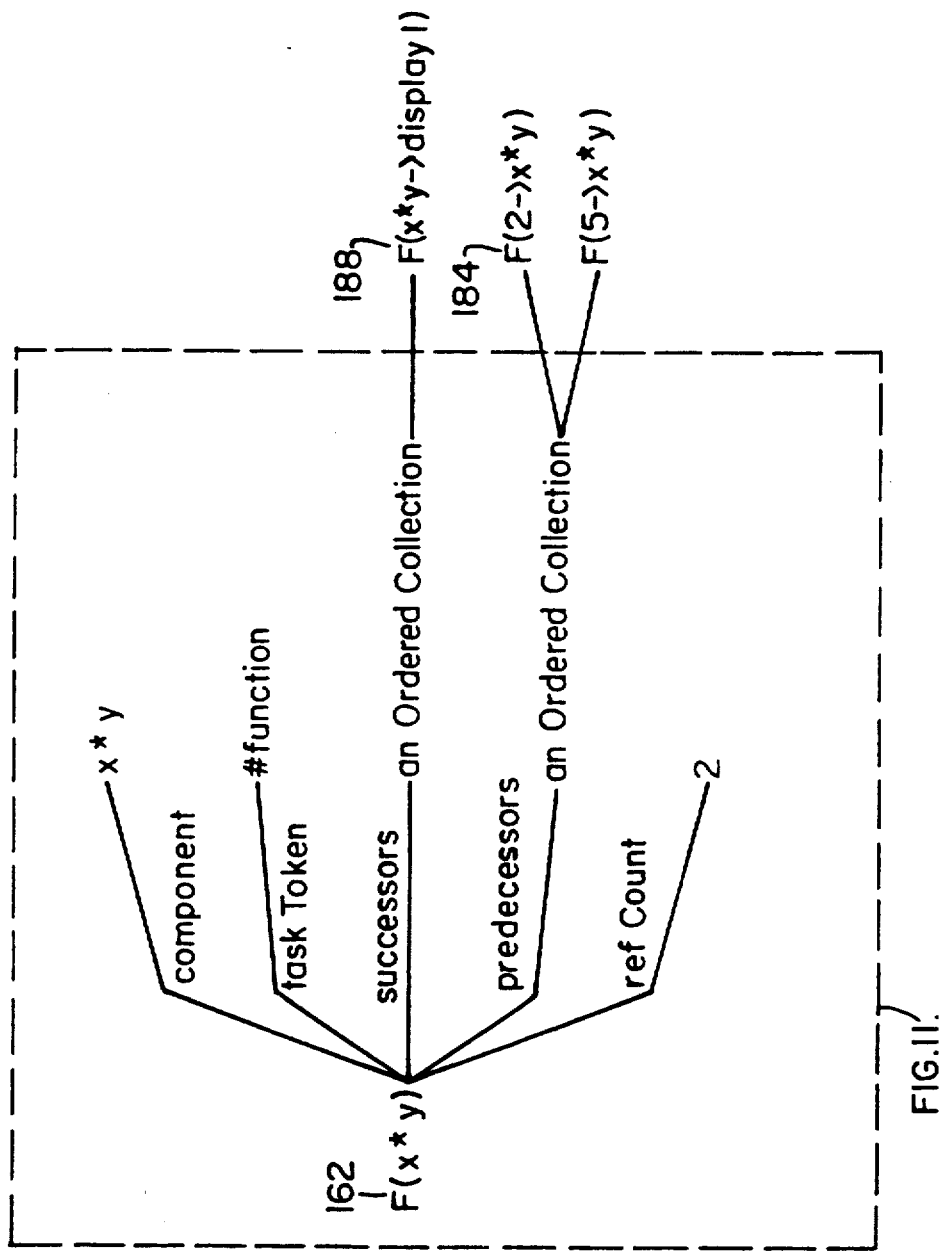
FIG. 13 is a diagram of the FIG. 11 multiply block's Function task data structure after the ordering rules shown in Appendix A have been applied.

FIG. 13 shows the data structure of the multiplier block Function task 162 after application of the ordering rules. The connection's Function task 188 now appears in the ordered collection of successors to the Function task 162 of the multiplier block. The connection's Function task 188 is the only task in the list of successors to the multiplier Function task, as appears in FIG. 12. The ordered collection of predecessor tasks now includes the Function task 184 of connection 133, labeled "F(2->x*y)" and the Function task of connection 135 (FIG. 8), labeled "F(5->x*-y)". These tasks must precede the multiplier block Function task 162 in accordance with the dependencies shown in FIG. 12 as prescribed by ordering Rule 6 (APP. A).

Next, the linearization method of execution requires sorting the tasks. Sorting the tasks to fill in the sortList includes the steps of: collect all tasks whose reference count is zero; add them to the end of the sortList (as a single collection); decrement their successors' reference counts; decrement their own reference counts; and, repeat that sequence of steps. The result is that sortList contains a list of collections of partially ordered tasks.

Figure 14:
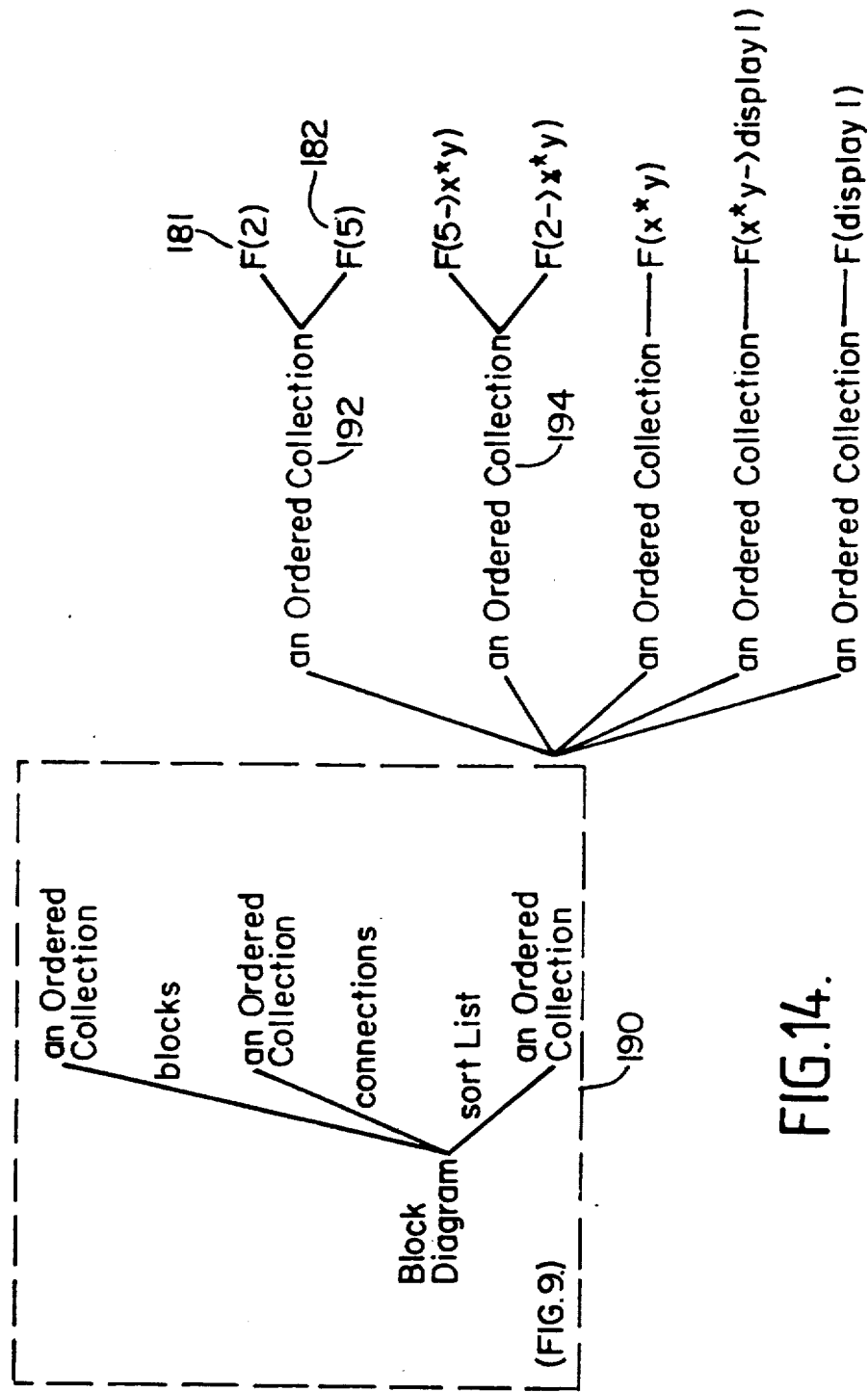
FIG. 14 is a diagram of a portion of the data structure of the block diagram of FIG. 8 after topologic sorting of the blocks' tasks and the connections' tasks.

Referring now to FIG. 14, the dashed box 190 outlines a portion of the figure which corresponds to FIG. 9. This figure includes additional data structure showing the contents of the ordered collection called the sortList. The sortList is itself a list of ordered collections or "interior lists." The first ordered collection 192 has two entries, the Function task 181 of the constant generator 132 and the Function task 182 of the constant generator 134. The sequence of execution of these two tasks is unimportant, hence the sortList is termed "partially ordered." The sequence of execution of the interior lists comprising the sortList is important. Thus, the ordered collection 192 must be executed prior to execution of the ordered collection 194, and so on down the list.

Figure 15:
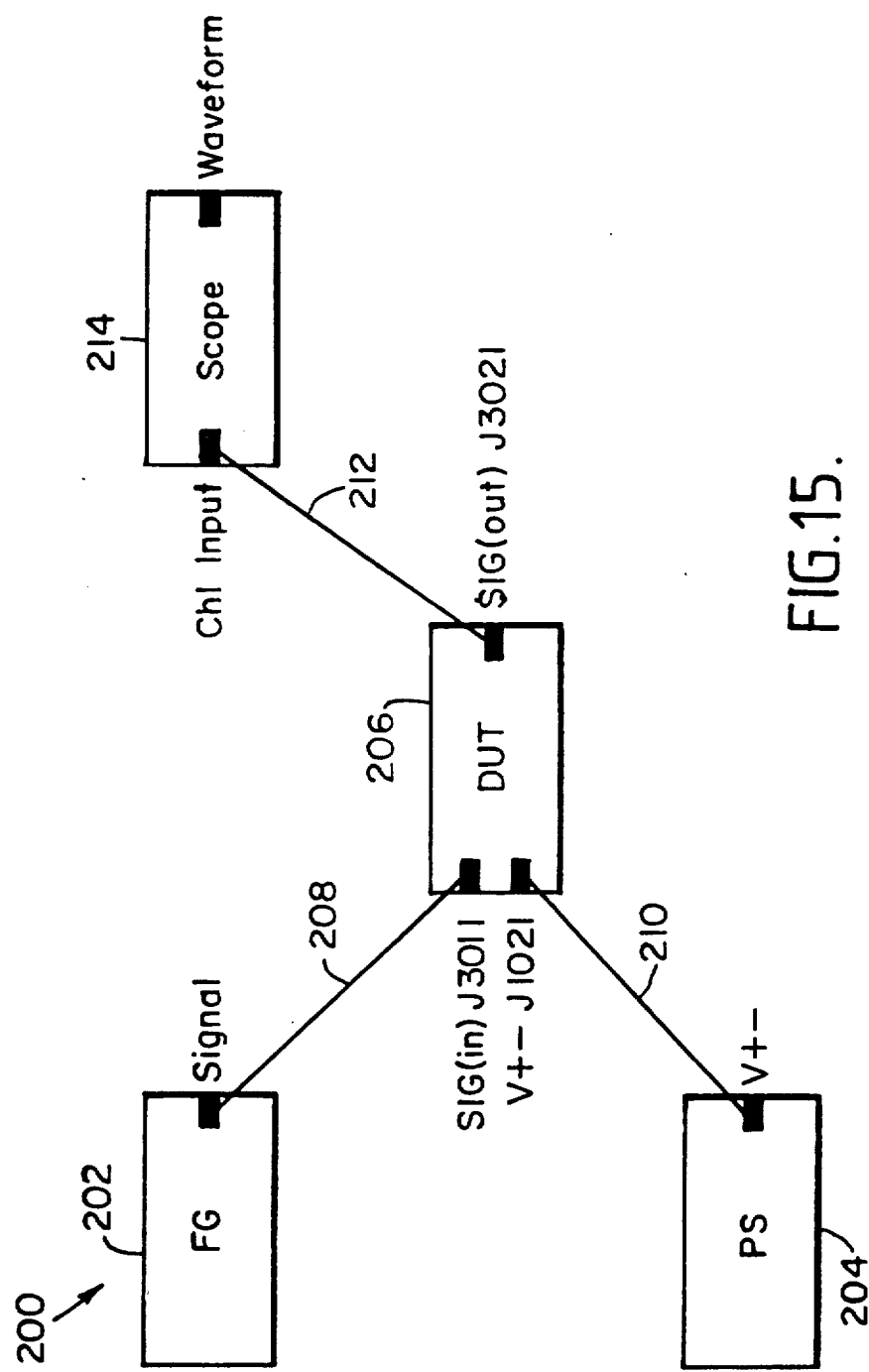
FIG. 15 is a fifth illustrative data flow diagram including blocks representing hardware instrument resources and connections representing physical data paths.

FIG. 15 shows a fifth illustrative data flow diagram, depicting a data flow process 200 including instrument resources, i.e., a signal generator 202, a power supply 204, an oscilloscope 214, a device under test (DUT) 206, and connections representing physical data paths 208, 210 and 212 interconnecting the instruments and DUT. The same kind of data structures described above may be used for execution of this data flow diagram.

Figure 16:
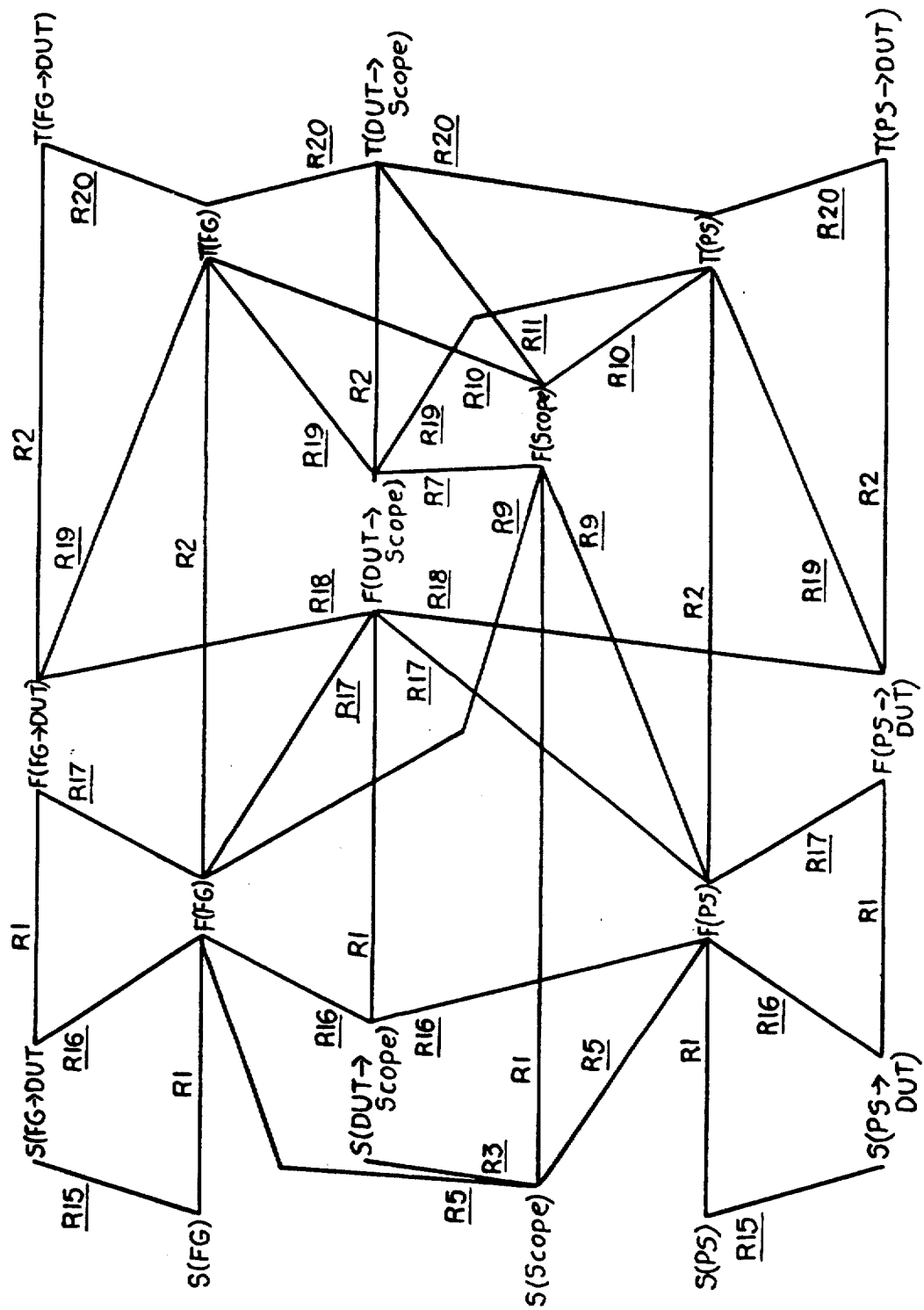
FIG. 16 is the network of tasks of the data flow diagram of FIG. 15 as related by the applicable ordering rules.

FIG. 16 shows the network of tasks of the data flow process illustrated in FIG. 15 as related by the applicable ordering rules. The rule numbers, corresponding to the numbers used in Appendix A, are shown adjacent the respective dependency line in FIG. 16 which is dictated by that rule. This graph, however, does not impose any input ordering restrictions on the DUT 206.

Figure 17:
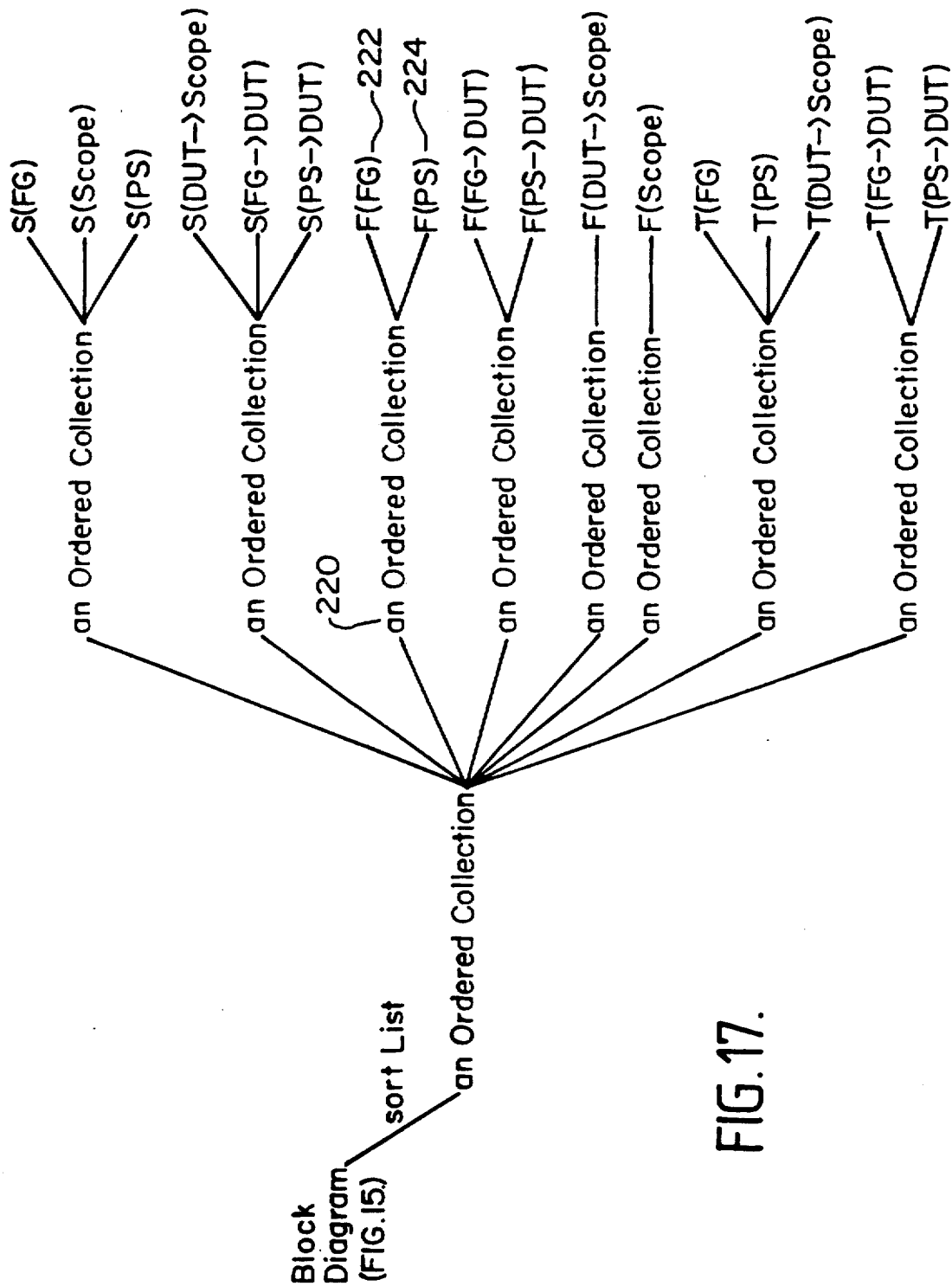
FIG. 17 is a diagram of the sortList portion of the data structure of the data flow diagram of FIG. 15, showing the diagram's sorted task list.

Sorting the information represented by the network of FIG. 16 results in the sortList shown in FIG. 17. Referring to FIG. 17, the third ordered collection in the sortList, at reference legend 220, contains two entries, the Function task 222 of the function generator (block 202) and the Function task 224 of the power supply (block 204). No particular order of execution is imposed on the tasks in collection 220. Accordingly, the function generator and the power supply can begin to function, i.e., produce outputs, in either order, possibly damaging the DUT 206.

Figure 18:
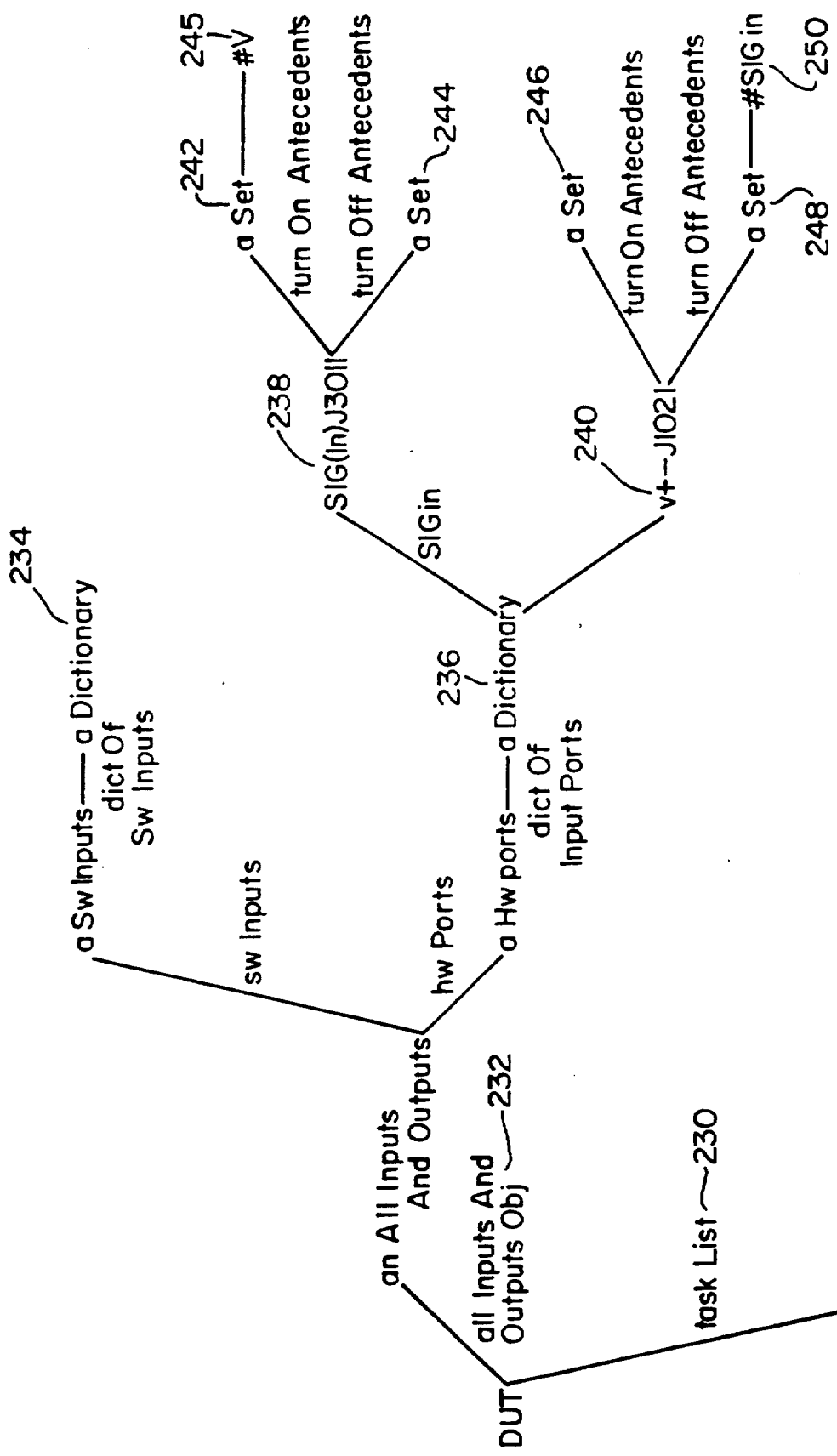
FIG. 18 is a diagram of another portion of the data structure for the diagram of FIG. 15, showing the DUT block's data structure including location of input ordering information.

The sequence of applying the inputs or removing the inputs to a device can be restricted where necessary to protect the devices from damage. FIG. 18 shows additional portions of the data structure of the DUT block 206. The block data structure includes a list of inputs and outputs 232 and a taskList 230. The data structure of the list of inputs and outputs includes a dictionary of software inputs 234 and a dictionary of hardware ports 236. Continuing down the hierarchy, the dictionary of hardware ports 236 contains entries for each hardware port of the DUT block. Here, there are a signal input 238 and power supply connections 240, corresponding to the SIG(in) and V+ — inputs to block 206 in FIG. 15. The signal input 238 includes a set of turn-on antecedents 242 and a set of turn-off antecedents 244. The set of turn-on antecedents has a single entry 245, containing a label "#V," a shorthand label signifying voltage, referring to the power supply inputs 240. Thus, the signal input 238 requires that the power supply input 240 precede it.

Similarly, power supply input data structure 240 provides for lists of turn-on antecedents 246 and turn-off antecedents 248. The list of turn-off antecedents includes an entry 250 labeled, "#SIGin," a label referring to the signal input 238. This requires that the signal input be removed before turning off or removing the power supply inputs.

Figure 19:
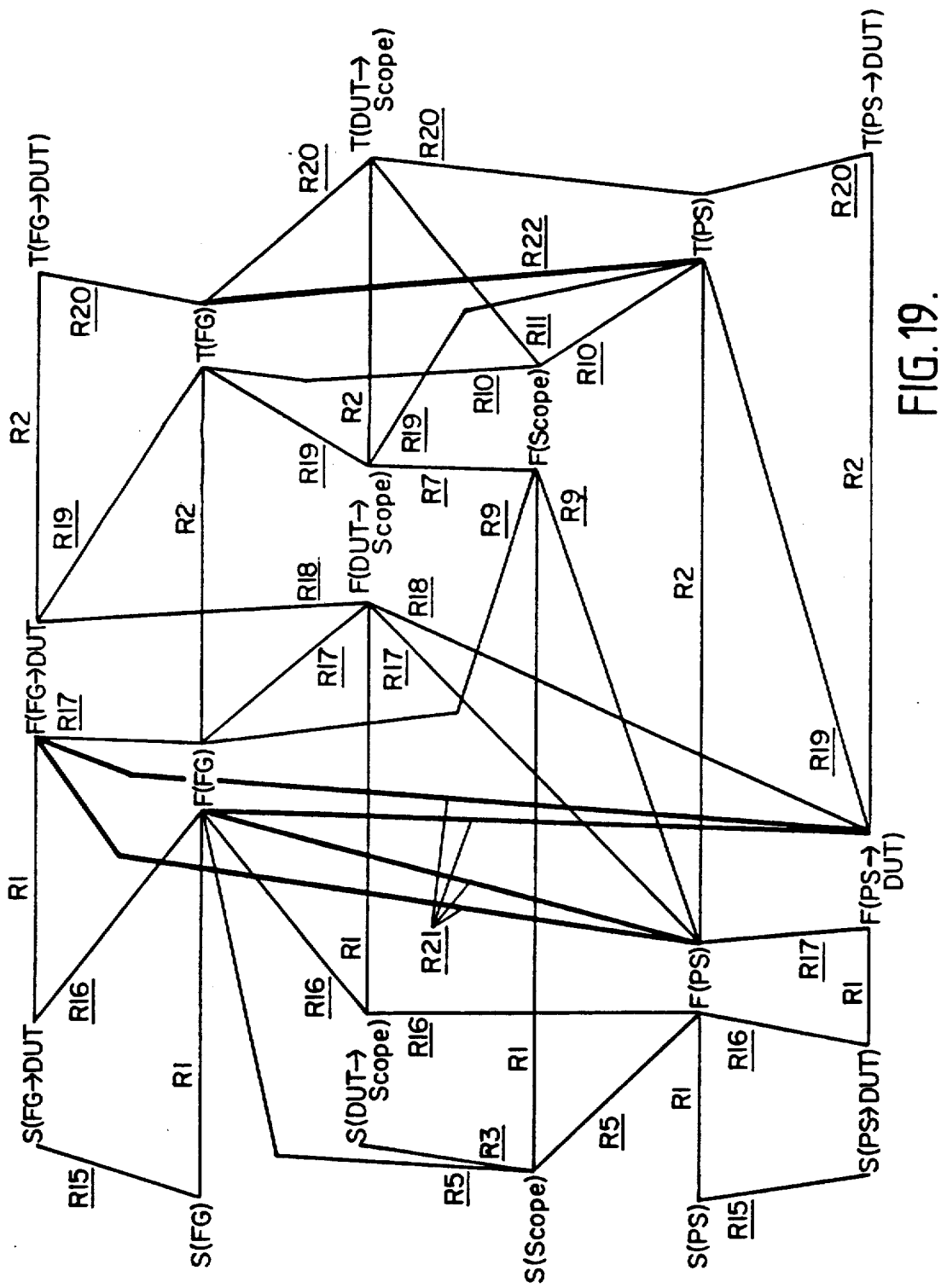
FIG. 19 is a sorted network showing dependencies among the tasks of the data flow diagram of FIG. 15 with the DUT's turn-on and turn-off ordering enforced.

The turn-on and turn-off restrictions thus implemented in the data structures are applied by rules 21 and 22, respectively, shown in Appendix A. These restrictions and associated rules give rise to additional dependencies in the data flow network. Referring now to FIG. 19, it shows a network indicating the dependencies among the tasks of the data flow diagram of FIG. 15, including the additional dependencies, represented by bold lines, resulting from application of ordering rules 21 and 22 where indicated.

Figure 20:
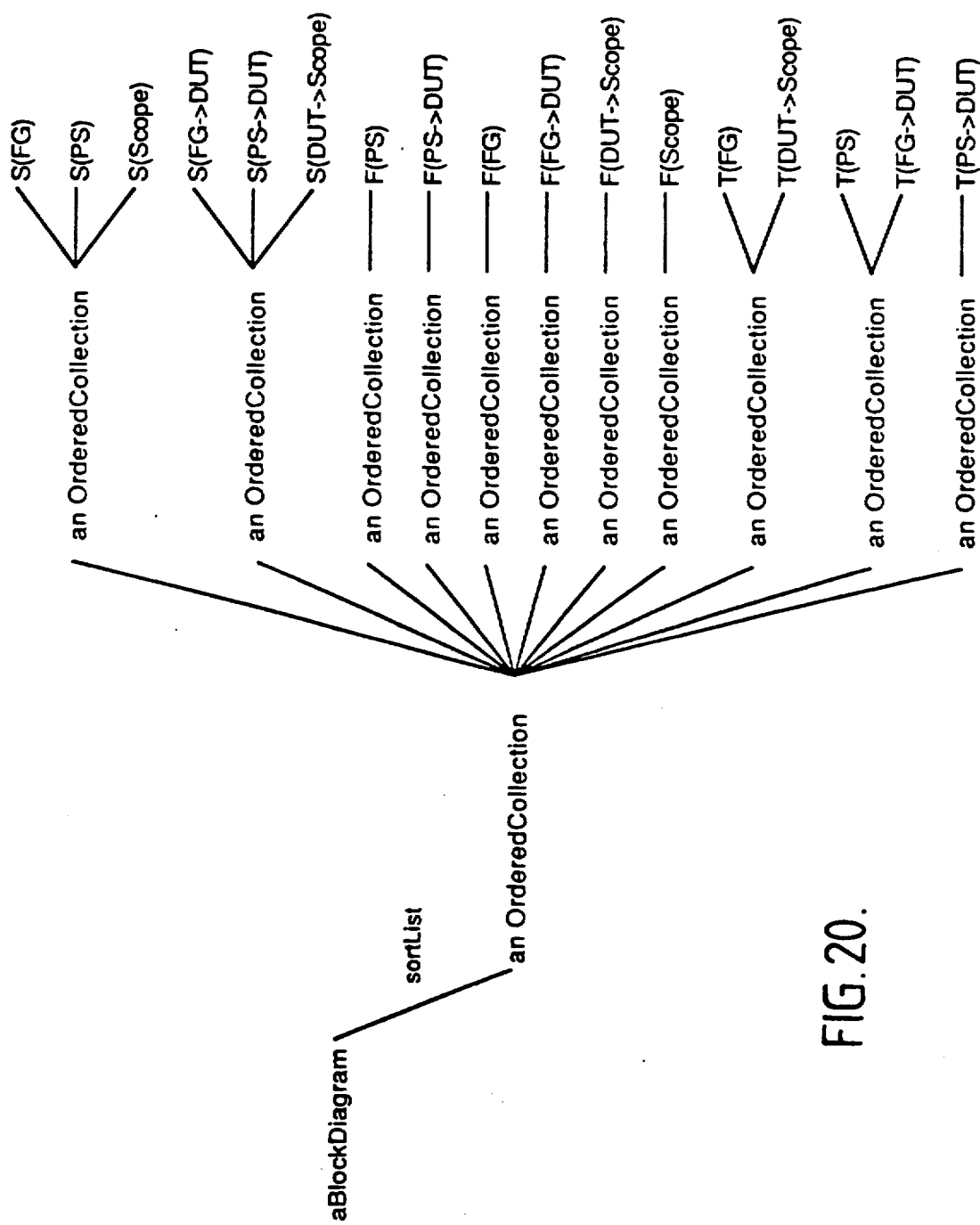
FIG. 20 is a diagram of the FIG. 15 data flow diagram's sorted task list as derived from the network of tasks of FIG. 19.

Referring now to FIG. 20, the block diagram of FIG. 15 is sorted into the sortList shown in FIG. 20 in accordance with all the dependencies shown in the network in FIG. 19. Comparison of this diagram to FIG. 17 shows the effect of the input ordering restrictions. The Function task 224 of the power supply here explicitly precedes the Function task 222 of the function generator, whereas as in FIG. 17 their order was indeterminate.

Thus, FIG. 20 includes a sorted list of all of the tasks required to properly set up, operate and terminate operation of the system represented by the block diagram in FIG. 15. FIG. 21 shows an example of output code, here in C++ language, for controlling the physical test system represented by the data flow diagram of FIG. 15. This code is generated automatically by operation of the invention, obviating the need for a user or programmer to manually interleave tasks.

Figure 22:
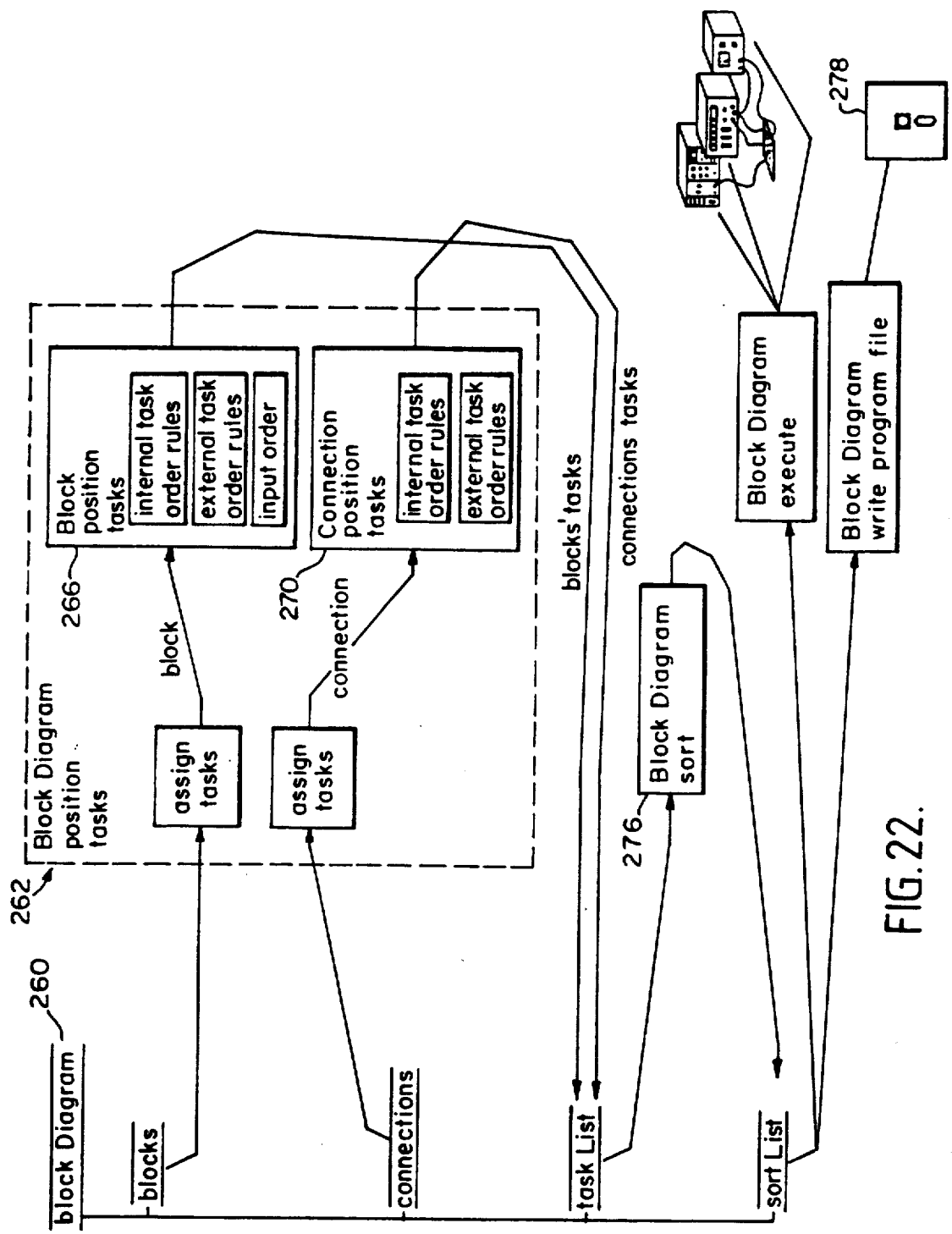
FIG. 22 is a diagram generally illustrating the operation of a computer-controlled test system in accordance with the present invention.

Referring now to FIG. 22, a diagram is shown illustrating in summary fashion the operation of a computer-controlled test or measurement system in accordance with the present invention. In the upper-left portion of the figure, blockDiagram 260 refers to a data structure called blockDiagram, described above with reference to FIGS. 9 and 14. Data defining a block diagram representing a data flow, or simply a "data flow diagram," is entered into the blockDiagram data structure; for example, by block diagram editor software.

The instruction "BlockDiagram position tasks," illustrated by dashed box 262, first causes assignment of appropriate tasks to each block and to each connection. Next, the instruction "Block position tasks" 266 orders the blocks' tasks by application of internal task order rules, external task order rules and input order rules. The resulting ordered list of blocks' tasks is filled into the data structure "taskList." Similarly, the instruction "Connection position tasks" 270 applies the task order rules to order the connections' tasks. Then, the ordered connections' tasks are appended to taskList.

The completed taskList is sorted by the "BlockDiagram sort" procedure 276, and the results used to fill in the sortList collection. Finally, the sortList may be used to control the test system, illustrated by the block labelled "BlockDiagram execute" or the sortList may be used to create a program file that can be written to a disk 278 for subsequent execution on a separate target system. Alternatively, where multiprocessing capability is provided, the sort procedure may be omitted and the taskList used to control execution.

Having illustrated and described the principles of our invention in a preferred embodiment thereof, it should be apparent to those skilled in the art that the invention can be modified in arrangement and detail without departing from such principles. We claim all modifications coming within the spirit and scope of the accompanying claims.

Appendix A
Task Ordering Rules

The Experiment Manager task ordering rules relate tasks of executable block diagram components (blocks and connections). All rules are applied if they can be. If a component does not have the principal task mentioned, the rule is not applied. If the principal task is present but components upstream have no tasks of the type specified in the rule, the rule is not applied.

The rules quite often impose redundant constraints among tasks because they are formulated to adequately position tasks for all combinations of components, and components need not have all the task types available in the system. Generating and working with these extra constraints is easier than dynamically trying to avoid them or later trying to remove them.

1. ExecutableComponent Methods For Task Positioning

Blocks and Connections inherit the internal task positioning rules by virtue of being types of ExecutableComponent. Thus, these rules apply to all components.

Position Tasks Internally

1. A component's setUp task precedes its function task, or its termination task if there is no function task.

```
   (task _ self setUpTask) notNil
       ifTrue:
           [task precedes: self getFunctionOrTerminationTask].
   ```

2. A component's function task precedes its termination task.

```
   (task _ self functionTask) notNil
       ifTrue: [task precedes: self getTerminationTask]
   ```

2. Block Methods For Task Positioning

Position SetUp

If the block has a setUp task:

```
(myTask _ self setUpTask) notNil
    ifTrue: [   ...<the following task positioning code>... ]
```

3. A block's setUp task precedes upstream (HW) connections' setUps (not recursive) (ex. the upstream connection's setUp may program a switch matrix which may need to know the block's setUp in order to choose an appropriate signal path).

```
   myTask precedes:
       (self
           tasksOfType: #setUpTask
           ofAllUpstream: HWConnection
           connectedOn: #collectionOfActiveHwInputs
           recursively: false).
   ```

4. A block's setUp task follows (SW) connections' functions upstream of parameter inputs (not recursive) (ex. parameter inputs must be available before a block can do its setUp).

```
   myTask follows:
       (self
           tasksOfType: #functionTask
           ofAllUpstream: SWConnection
           connectedOn: #collectionOfActiveParameterInputs
           recursively: false).
   ```

5. A block's setUp task precedes upstream HW blocks' functions or the functions that supply signals to the upstream block (recursive) (ex. a multi-meter should have its range set before an upstream signal is applied).

```
   myTask precedes:
       (self
           tasksOfType: #functionTask
           ofAllUpstream: Block
           connectedOn: #collectionOfActiveHwInputs
           recursively: true).
   ```

Position Function

If the block has a function task:

```
(myTask _ self functionTask) notNil
    ifTrue: [   ...<the following task positioning code>... ]
```

6. A block's function task follows swConnections' (upstream of software inputs) functions (not recursive) (i.e. data flows downstream).

```
myTask follows:
    (self
        tasksOfType: #functionTask
        ofAllUpstream: SWConnection
        connectedOn: #collectionOfActiveSwInputs
        recursively: false).
```

7. A block's function task follows hwConnections' (upstream of hardware inputs) functions (not recursive) (i.e. data flows downstream).

```
myTask follows:
    (self
        tasksOfType: #functionTask
        ofAllUpstream: HWConnection
        connectedOn: #collectionOfActiveHwInputs
        recursively: false).
```

8. A block's function task follows connections' (upstream of parameter inputs) functions (not recursive) (i.e. data flows downstream).

```
myTask follows:
    (self
        tasksOfType: #functionTask
        ofAllUpstream: SWConnection
        connectedOn: #collectionOfActiveParameterInputs
        recursively: false).
```

9. A block's function task follows blocks' (upstream of hardware inputs) functions or the functions of blocks that supply that block with signals (recursive) (i.e. data (signals) flows downstream).

```
myTask follows:
    (self
        tasksOfType: #functionTask
        ofAllUpstream: Block
        connectedOn: #collectionOfActiveHwInputs
        recursively: true).
```

10. A block's function task precedes blocks' (upstream of hardware inputs) terminations or the terminations of blocks that supplied that block with signals (recursive). Properly relates function with upstream termination in case block has no termination task. (ex. digitizer should finish acquisition before upstream generators terminate).

```
myTask precedes:
    (self
        tasksOfType: #terminationTask
        ofAllUpstream: Block
        connectedOn: #collectionOfActiveHwInputs
        recursively: true).
```

11. A block's function task precedes connections' (upstream of hardware inputs) terminations. Properly relates function with upstream connection termination in case block has no termination task. (ex. digitizer should finish acquisition before upstream signal paths terminate).

```
myTask precedes:
    (self
        tasksOfType: #terminationTask
```

```
            ofAllUpstream: HWConnection
            connectedOn: #collectionOfActiveHwInputs
            recursively: false).
```

Position Termination

If the block has a termination task:

```
(myTask _ self terminationTask) notNil
    ifTrue: [  ...<the following task positioning code>... ]
```

12. A block's termination task precedes upstream (HW) connections' termination (ex. allow the instrument to terminate before taking down the signal path).

```
myTask precedes:
    (self
        tasksOfType: #terminationTask
        ofAllUpstream: HWConnection
        connectedOn: #collectionOfActiveHwInputs
        recursively: false)).
```

13. A block's termination task follows upstream (HW) blocks' termination tasks, or the termination tasks of blocks that supply block (ex. avoid "hot switching" by turning off the signal before the receiving instrument opens its input switch)

```
myTask follows:
    (self
        tasksOfType: #terminationTask
        ofAllUpstream: Block
        connectedOn: #collectionOfActiveHwInputs
        recursively: true)).
```

3. SWConnection Methods For Task Positioning

Position Function

If the connection has a function task:

```
(myTask _ self functionTask) notNil
    ifTrue: [  ...<the following task positioning code>... ]
```

14. A connection's function task follows upstream block's function (the block must have a function because this is a software connection and must be connected to a block with a function that produces the data). (i.e. data flows downstream).

```
myTask follows:
    (self
        tasksOfType: #functionTask
        ofAllUpstream: Block
        connectedOn: #collectionOfActiveSwInputs
        recursively: false).
```

4. HWConnection Methods For Task Positioning

Position SetUp

If the connection has a setUp task:

```
(myTask _ self setUpTask) notNil
    ifTrue: [  ...<the following task positioning code>... ]
```

15. A connection's setUp task follows the upstream block's setUp if the block has one (no recursion). (ex. the connection's setUp may program a switch matrix which may need to know the upstream block's setUp in order to choose an appropriate signal path).

```
myTask follows:
    (self
        tasksOfType: #setUpTask
        ofAllUpstream: Block
        connectedOn: #collectionOfActiveHwInputs
        recursively: false).
```

16. A connection's setUp task precedes the upstream block's function if it has one, or functions of blocks further upstream connected on hardware inputs (recursive) (ex. a signal path should be setUp before an upstream signal is applied).

```
myTask precedes:
    (self
        tasksOfType: #functionTask
        ofAllUpstream: Block
        connectedOn: #collectionOfActiveHwInputs
        recursively: true).
```

Position Function

If the hardware (physical) connection has a function task (e.g., for diagram animation or passing information about the physical signal):

```
(myTask _ self functionTask) notNil
    ifTrue: [  ...<the following task positioning code>... ]
```

17. A hwConnection's function task follows the upstream block's function or the function tasks of blocks upstream of hwInputs. (ex. the connection's function may carry a time-stamp indicating when the signal was applied).

```
myTask follows:
    (self
        tasksOfType: #functionTask
        ofAllUpstream: Block
        connectedOn: #collectionOfActiveHwInputs
        recursively: true).
```

18. A hwConnection's function task follows upstream connections' functions or the function tasks of connections upstream of the upstream block. (ex. the connection's function may carry a time-stamp indicating when the signal was applied).

```
myTask follows:
    (self
        tasksOfType: #functionTask
        ofAllUpstream: HWConnection
        connectedOn: #collectionOfActiveHwInputs
        recursively: false).
```

19. A hwConnection's function task precedes upstream block's termination or the termination tasks of blocks upstream of the upstream block. (ex. the connection's function may carry a time-stamp indicating when the signal was applied, and that time-stamp should arrive before the signal is turned off).

```
myTask precedes:
    (self
```

```
        tasksOfType: #terminationTask
        ofAllUpstream: Block
        connectedOn: #collectionOfActiveHwInputs
        recursively: true).
```

Position Termination

If the hardware (physical) connection has a termination task (e.g., for breaking connections in a signal path):

```
(myTask _ self terminationTask) notNil
    ifTrue: [  ...<the following task positioning code>... ]
```

20. A connection's termination task follows upstream block's termination task, or termination tasks of blocks further upstream connected on hardware inputs (recursive) (ex. avoid "hot switching" by turning off the signal source before taking down the signal path).

```
myTask follows:
    (self
        tasksOfType: #terminationTask
        ofAllUpstream: Block
        connectedOn: #collectionOfActiveHwInputs
        recursively: true).
```

5. Methods For Input Ordering

The order in which inputs are applied to a block is determined by the block having the requirement. For every block, each of its inputs has a data structure which can hold a list of its turn-on antecedants. That is, a list of other inputs of the block which must be turned on or available before data is made available to this input. Likewise, each input has a list of turn-off antecedants. The turn-on and turn-off ordering is acomplished by constraining the order of function and termination tasks of connections and blocks upstream of the block having the input order requirements. For each input considered during input ordering, upstream tasks are gathered according to the following variations. If an input is a hardware input, the rule searches recursively until it finds the spified upstream tasks. If an input is a software input, the rule searches only the immediately upstream connection and block for their specified tasks.

Position TurnOn Antecedants

21. For each input with turn-on antecedants, the function task of the connection and the block upstream of that input follow the function tasks of connections and blocks upstream of the turn-on antecedants' inputs.

Position TurnOff Antecedants

22. For each input with turn-off antecedants, the termination task of the block upstream of that input follows the termination tasks of blocks upstream of the turn-off antecedants' inputs.

Appendix B
Execution Example Code (Smalltalk-80)

BLOCK DIAGRAM
execute

*"Execute the data-flow program represented by this block diagram.*

*Step through the collections in sortList telling each task to execute."* self sortList do: [:interiorList |
 interiorList do: [:task | task execute]]

BLOCK DIAGRAM
sortList

*"Return the blockDiagram's sorted task list. If the list is nil (not been computed since an editing change) rebuild the list by assigning and positioning block and connection tasks, then sorting the list."* sortList isNil ifTrue: [
 self positionTasks.
 self sort].
↑ sortList

BLOCK DIAGRAM
positionTasks

*"Create a new, empty taskList (taskList is an instance variable of the blockDiagram and global to this method). Tell all blocks and connections in the diagram to assign their tasks. Then, tell first, each block and then each connection to position its tasks and add pointers to them to this blockDiagram's taskList."* taskList ← OrderedCollection new.
blocks do: [:aBlock | aBlock assignTasks].
connections do: [:aConnection | aConnection assignTasks].

blocks do: [:aBlock |
 aBlock positionTasks.
 taskList addAll: aBlock taskList].
connections do: [:aConnection |
 aConnection positionTasks.
 taskList addAll: aConnection taskList]

BLOCK DIAGRAM
sort

*"Topologically sort tasks in taskList into collections of tasks in sortList:*

*Create a new, empty sortList (sortList is an instance variable of the blockDiagram and global to this method).*

*Loop:*

*ask self to get all the tasks whose reference counts = 0*

*While there are such tasks:*

*add them to the end of sortList and tell them to decrement their successors' reference counts.*

*Result is sortList: a collection of collections of partially ordered tasks: e.g., ((task task) (task) (task task))."*

| zeros | sortList ← OrderedCollection new.
[zeros ← self zeroTasks.
(zeros isEmpty not) whileTrue: [
    sortList addLast: zeros.
    zeros do: [:aTask | aTask decrementSuccessors]]

BLOCK DIAGRAM
zeroTasks

*"Return a collection of tasks that respond to the 'refCountZero' query with 'true'."*

↑ taskList select: [:aTask | aTask refCountZero]

TASK CLASS
newFor: aComponent task: token

*"Create a new task object (data structure) and tell it it belongs to a component and represents a task specified by token."*

↑ self new component: aComponent task: token

TASK
component: aComponent task: token

*"Initialize a task object and associate it with a component (block or connection) and a task type."* self initialize.
component ← aComponent.
taskToken ← token

TASK
initialize

*"Initialize a task's reference count to zero and its successors and predecessors to empty collections."* refCount ← 0.
successors ← OrderedCollection new: 3.
predecessors ← OrderedCollection new: 3

TASK
execute

> *"Tell the component to execute its code associated with the token held in instanceVariable 'taskToken.'"* component executeTask: taskToken

TASK
decrementSuccessors

> *"Tell each task in the successors list to decrement its reference count. Then decrement this task's reference count. Because this method is called, from BlockDiagram-sort, when this task has a zero reference count, the final decrement sets the count to -1, insuring the task will not appear again, in sorting, as a zero-reference-count task."* successors do: [:each | each decrementRefCount].
self decrementRefCount

TASK
decrementRefCount

> *"Decrement the reference count instance variable."* refCount ← refCount - 1

TASK
precedes: tasks

> *"Establishes an order between two tasks. In this case, the receiver is placed ahead, in execution precedence, of aTask."* tasks do: [:aTask | self addSuccessor: aTask]

TASK
follows: tasks

> *"Establishes an order between two tasks. In this case, the receiver is placed after, in execution precedence, of aTask."* tasks do: [:aTask | aTask addSuccessor: self]

TASK
addSuccessor: aTask

*"Add aTask as this task's successor by placing a pointer to aTask
in this task's successors list. Then tell aTask to establish this
task as its predecessor (a circular link), and to increment its
reference count (counts number of predecessors)."* successors addLast: aTask.
aTask addPredecessor: self.
aTask incrementRefCount

TASK
addPredecessor: aTask

*"Add aTask as this task's predecessor by placing a pointer to aTask
in this task's predecessors list."* predecessors addLast: aTask

TASK
refCountZero

*"Report whether this task's reference count is equal to zero."*

↑ refCount ← 0

EXECUTABLE COMPONENT (all blocks and connections)
assignTasks

*"If a component's taskList has not been built or is empty, have
it build new task objects and assign them to the taskList. If
the list is in place, have each task reset its reference
count, a count of predecessors that have not yet been
considered in topological sorting."*

(taskList isNil or: [taskList isEmpty])
    ifTrue: [self assignNewTasks]
    ifFalse: [self resetTasks]

EXECUTABLE COMPONENT (all blocks and connections)
assignNewTasks

*"Build a new, empty taskList for this component. For each task
type token (#setUp, #function, or #termination) this component
requires, build a task object, link it with the component, and
add it to the component's taskList."* taskList ← OrderedCollection new: 3.
self taskTokens do: [:token |
    taskList add: (Task newFor: self task: token)].

EXECUTABLE COMPONENT (all blocks and connections)
resetTasks

*"Re-initialize tasks in the component's taskList. Used prior to applying positioning rules."* taskList do: [:task | task initialize]

EXECUTABLE COMPONENT (all blocks and connections)
positionTasks self positionTasksInternally.
self positionTasksExternally

EXECUTABLE COMPONENT (all blocks and connections)
positionTasksInternally

*"A component's set-up task precedes its function and termination tasks and its funtion task precedes its termination task."*

| task |

(task ← self setUpTask) notNil
    ifTrue: [task precedes: self getFunctionOrTerminationTask].

(task ← self functionTask) notNil
    ifTrue: [task precedes: self getTerminationTask]

EXECUTABLE COMPONENT (all blocks and connections)
getSetUpAndFunctionTasks

*"Returns both the component's setUp and function tasks as an ordered collection."*

| list task | list ← OrderedCollection new: 2.
(task ← self setUpTask) notNil ifTrue: [list addLast: task].
(task ← self functionTask) notNil ifTrue: [list addLast: task].
↑ list

EXECUTABLE COMPONENT (all blocks and connections)
getFunctionOrTerminationTask

*"Returns either the function task or the terminate task or nothing as an ordered collection."*

| list task | list ← OrderedCollection new: 1.

```
(task ← self functionTask) notNil
    ifTrue: [list addLast: task]
    ifFalse: [(task ← self terminationTask) notNil
        ifTrue: [list addLast: task]].
↑ list
```

EXECUTABLE COMPONENT (all blocks and connections)
getTerminationTask

> *"Returns the terminate task or nothing as an ordered collection."*

| list task |

```
list ← OrderedCollection new: 1.
(task ← self terminationTask) notNil
        ifTrue: [list addLast: task].
↑ list
```

EXECUTABLE COMPONENT (all blocks and connections)
positionTasksExternally

> *"Position the set-up, function and termination tasks with respect to upstream tasks."*

```
self positionSetUp.
self positionFunction.
self positionTermination
```

BLOCK
positionTasksExternally

> *"Block overides the ExecutableComponents 'positionTasksExternally' method with this method.*
>
> *Position self's tasks with respect to upstream block and connection tasks using the ExecutableComponent ordering method (the method this method overrides) and the specific input ordering rules for this block."*

```
super positionTasksExternally.
self orderInputs
```

BLOCK
positionSetUp

| myTask |

> *"This method implements the rules for positioning a block's set-up task with respect to upstream tasks.*
>
> *1. A block's set-up task precedes upstream (HW) connections' set-ups (not recursive) (ex. the upstream connection's set-up may program a switch matrix which may need to know the block's set-up in order to choose an appropriate signal path).*

*2. A block's set-up task follows (SW) connections' functions upstream of parameter inputs (not recursive) (ex. parameter inputs must be available before a block can do its set-up).*

*3. A block's set-up task precedes upstream HW blocks' functions or the functions that supply signals to the upstream block (recursive) (ex. a multi-meter should have its range set before an upstream signal is applied)."*

```
myTask ← self setUpTask.
myTask notNil ifTrue:
    [myTask precedes:
        (self
            tasksOfType: #setUpTask
            ofAllUpstream: HWConnection
            connectedOn: #collectionOfActiveHwInputs
            recursively: false).

myTask follows:
        (self
            tasksOfType: #functionTask
            ofAllUpstream: SWConnection
            connectedOn: #collectionOfActiveParameterInputs
            recursively: false).

myTask precedes:
        (self
            tasksOfType: #functionTask
            ofAllUpstream: Block
            connectedOn: #collectionOfActiveHwInputs
            recursively: true)]
```

BLOCK
positionFunction
    | myTask |

*"This method implements the rules for positioning a block's function task with respect to upstream tasks.*

*4. A block's function task follows swConnections' (upstream of software inputs) functions (not recursive) (i.e. data flows downstream).*

*5. A block's function task follows hwConnections' (upstream of hardware inputs) functions (not recursive) (i.e. data flows downstream).*

*6. A block's function task follows connections' (upstream of parameter inputs) functions (not recursive) (i.e. data flows downstream).*

*7. A block's function task follows blocks' (upstream of hardware inputs) functions or the functions of blocks that supply that block with signals (recursive) (i.e. data (signals) flows downstream).*

*8. A block's function task precedes blocks' (upstream of hardware inputs) terminations or the terminations of blocks*

*that supplied that block with signals (recursive). Properly relates function with upstream termination in case block has no termination task. (ex. digitizer should finish acquisition before upstream generators terminate).*

*9). A block's function task precedes connections' (upstream of hardware inputs) terminations. Properly relates function with upstream connection termination in case block has no termination task. (ex. digitizer should finish acquisition before upstream signal paths terminate)."*

```
myTask ← self functionTask.
myTask notNil ifTrue: [
    myTask follows:
        (self
            tasksOfType: #functionTask
            ofAllUpstream: SWConnection
            connectedOn: #collectionOfActiveSwInputs
            recursively: false).

myTask follows:
        (self
            tasksOfType: #functionTask
            ofAllUpstream: HWConnection
            connectedOn: #collectionOfActiveHwInputs
            recursively: false).

myTask follows:
        (self
            tasksOfType: #functionTask
            ofAllUpstream: SWConnection
            connectedOn: #collectionOfActiveParameterInputs
            recursively: false).

myTask follows:
        (self
            tasksOfType: #functionTask
            ofAllUpstream: Block
            connectedOn: #collectionOfActiveHwInputs
            recursively: true).

myTask precedes:
        (self
            tasksOfType: #terminationTask
            ofAllUpstream: Block
            connectedOn: #collectionOfActiveHwInputs
            recursively: true).

myTask precedes:
        (self
            tasksOfType: #terminationTask
            ofAllUpstream: HWConnection
            connectedOn: #collectionOfActiveHwInputs
            recursively: false)]
```

BLOCK
positionTermination

| myTask |

*"This method implements the rules for positioning a block's termination task with respect to upstream tasks.*

*10. A block's termination task precedes upstream (HW) connection's termination (ex. allow the instrument to terminate before taking down the signal path).*

*11. A block's termination task precedes upstream (HW) blocks' termination tasks, or the termination tasks of blocks that supply block (ex. allow the instrument to terminate before turning off the signal)."* myTask ← self terminationTask.
myTask notNil ifTrue: [
    myTask precedes:
        (self
            tasksOfType: #terminationTask
            ofAllUpstream: HWConnection
            connectedOn: #collectionOfActiveHwInputs
            recursively: false).

myTask precedes:
        (self
            tasksOfType: #terminationTask
            ofAllUpstream: Block
            connectedOn: #collectionOfActiveHwInputs
            recursively: true)]

BLOCK
orderInputs

*"A block tells its 'allInputsAndOutputsObj' to take care of input ordering."* allInputsAndOutputsObj orderInputs

ALL INPUTS AND OUTPUTS
orderInputs

*"Enforce each active input's (software or hardware) turn-on and turn-off requirements."* swInputs collectionOfActiveInputs,
hwPorts collectionOfActiveInputs do:
    [:anInput |
        self orderForTurnOn: anInput.
        self orderForTurnOff: anInput]

ALL INPUTS AND OUTPUTS
orderForTurnOn: anInput .

*"Enforce the turn-on order requirements of anInput.*

*Collect anInput's turn-on antecedants' identifying symbols in beforeSymbols. If beforeSymbols contains any antecedant symbols,*

*collect the function (turnOn) tasks upstream of that input in afterTasks.*

*Convert the collection of symbols of the inputs that are to turn on before anInput to a collection of the actual inputs, then add the function tasks upstream of the beforeSymbol input to the beforeTasks collection.*

*Finally, make each of the afterTasks follow all of the beforeTasks."*

| afterTasks beforeSymbols beforeTasks beforeInput | beforeSymbols ← anInput turnOnAntecedents.

beforeSymbols isEmpty not ifTrue: [
        afterTasks ← OrderedCollection new: 4.
        anInput addUpstreamTurnOnTasks: afterTasks.

beforeTasks ← OrderedCollection new: 4.
        beforeSymbols do: [ :aBeforeSymbol |
            beforeInput ← self returnActiveInput: aBeforeSymbol.
            beforeInput notNil ifTrue: [
                beforeInput addUpstreamTurnOnTasks: beforeTasks]].

afterTasks do: [:anAfterTask |
            anAfterTask follows: beforeTasks]]

ALL INPUTS AND OUTPUTS
orderForTurnOff: anInput

*"Enforce the turn-off order requirements of anInput.*

*Collect anInput's turn-off antecedants' identifying symbols in beforeSymbols. If beforeSymbols contains any antecedant symbols,*

*collect the termination tasks upstream of that input in afterTasks.*

*Convert the collection of symbols of the inputs that are to turn off before anInput to a collection of the actual inputs, then add the termination tasks upstream of the beforeSymbol input to the beforeTasks collection.*

*Finally, make each of the afterTasks follow all of the beforeTasks."*

| afterTasks beforeSymbols beforeTasks beforeInput | beforeSymbols ← anInput turnOffAntecedents.
    beforeSymbols isEmpty not ifTrue: [
        afterTasks ← OrderedCollection new: 4.
        anInput addUpstreamTurnOffTasks: afterTasks.

beforeTasks ← OrderedCollection new: 4.
        beforeSymbols do: [ :aBeforeSymbol |

```
                beforeInput ← self returnActiveInput: aBeforeSymbol.
                beforeInput notNil ifTrue: [
                        beforeInput addUpstreamTurnOffTasks: beforeTasks]].

afterTasks do: [:anAfterTask | anAfterTask follows: beforeTasks]]
```

ALL INPUTS AND OUTPUTS
returnActiveInput: aSymbol

*"Check for the symbol first in the swInputs list. If it's
there, return the correponding input. If it's not there, check
the hwPorts list.[1]"*

```
((swInputs isInCollection: aSymbol)
        and: [swInputs isActive: aSymbol])
                ifTrue: [↑ swInputs returnInput: aSymbol].
((hwPorts isInCollection: aSymbol)
        and: [hwPorts isActiveAndInput: aSymbol])
                ifTrue: [↑ hwPorts returnPort: aSymbol]
                ifFalse: [↑ nil]
```

HW INPUT
addUpstreamTurnOnTasks: taskList

*"Add the function tasks (that control the arrival of signals
(turnOn)) of the upstream connection and block to taskList."*

```
connection
        getTasksOfType: #functionTask
        fromResource: HWConnection
        connectedOn: #collectionOfActiveHwInputs
        recursively: false
        addToTaskList: taskList
        alreadyVisited: (OrderedCollection new: 2).

connection
        getTasksOfType: #functionTask
        fromResource: Block
        connectedOn: #collectionOfActiveHwInputs
        recursively: true
        addToTaskList: taskList
        alreadyVisited: (OrderedCollection new: 2).
```

---

Whether an input is active (whether it participates in connection and task positioning) depends upon a block's parameter settings. The mechanisms for manipulating input activity are not germane to this application.

HW INPUT
addUpstreamTurnOffTasks: taskList

*"Tell the connection to add the upstream block's termination
(that controls the removal of signals (data doesn't count))
task to 'taskList' searching recursively upstream until
termination tasks are found."*

```
connection
        getTasksOfType: #terminationTask
        fromResource: Block
        connectedOn: #collectionOfActiveHwInputs
```

```
        recursively: true
        addToTaskList: taskList
        alreadyVisited: (OrderedCollection new: 2).

SW INPUT
addUpstreamTurnOnTasks: taskList

"Add the function task of the upstream connection
    and block to taskList."

connection
        getTasksOfType: #functionTask
        fromResource: SWConnection
        connectedOn: #collectionOfActiveSwInputs
        recursively: false
        addToTaskList: taskList
        alreadyVisited: (OrderedCollection new: 2).

connection
        getTasksOfType: #functionTask
        fromResource: Block
        connectedOn: #collectionOfActiveSwInputs
        recursively: false
        addToTaskList: taskList
        alreadyVisited: (OrderedCollection new: 2).

SW INPUT
addUpstreamTurnOffTasks: taskList

"Since software inputs aren't concerned with termination,
    add nothing to taskList and return."

↑ self

HW CONNECTION, SW CONNECTION
positionSetUp
positionFunction
positionTermination (see Task Ordering Rules Appendix A)
```

We claim:

1. A method of operating a computer system to automatically generate a sequence of computer instructions for controlling a system of resources topologically interconnected and operable to implement a data flow process, the data flow process being represented by block diagram data entered in the computer system with the resources including blocks for performing software functions and for representing and operating physical equipment and including connections representing and operating the data flow of software quantities from one block to another and representing the flow of data and operating physical linkages between the physical equipment, comprising the steps of:

prestoring in the computer system for each resource block and physical connection a set of implementing instructions;

identifying for each prestored set of implementing instructions a set of different types of tasks to be performed for each resource indicated by the block diagram data;

interleaving the tasks identified from the sets of implementing instructions in accordance with a predetermined set of task-positioning rules that order the tasks according to the data flow interconnections among the resources and the requirements for preparing the physical equipment and linkages for operation, initiating and terminating the operation, to form a network of dependencies among the tasks; and generating from the network the sequence of computer instructions for controlling the data flow process.

2. The method of claim 1 further comprising the step of executing the sequence of computer instructions in accordance with the network and the predetermined task-positioning rules to control the system of resources in order to perform the data flow process.

3. A method as recited in claim 2 wherein the generating and executing steps comprise the steps of:

sorting the tasks to form a sorted list of tasks in accordance with the network and the predetermined set of task-positioning rules;

linking sets of instructions corresponding to the tasks in the network in accordance with the sorted list to form a chronological sequence of instructions as the sequence of computer instructions to effect the data flow process; and outputting the sequence of computer instructions as a software program executable by a computer-controlled test system for implementing the data flow process.

4. A method as recited in claim 3 wherein the sorting step comprises the steps of:

partially ordering the network of tasks and dependencies by topological sorting to produce a list of tasks; and sequentially executing each list of tasks on the sorted task list, including sequentially executing the tasks on each sorted task list, thereby changing the state of the corresponding resource and producing data for successor tasks.

5. A method as recited in claim 2 wherein the generating and executing steps comprise the steps of:

defining standard processes in accordance with a multiprocessing operating system;

translating each task into one of the standard processes;

linking the standard processes in accordance with the network, the tasks and the predetermined set of task-positioning rules, thereby defining root processes and dependent processes; and executing the root and dependent processes.

6. A method as recited in claim 1 wherein the interleaving step comprises the steps of:

applying internal rules from the set of predetermined task-positioning rules for positioning the tasks associated with each resource relative to each other; and applying external rules from the set of predetermined task-positioning rules for positioning the tasks associated with all the resources relative to each other.

7. A method as recited in claim 6 wherein the interleaving step further comprises the step of applying input ordering rules from the set of predetermined task-positioning rules to each resource having multiple inputs for positioning the resources upstream of the resource having multiple inputs relative to each other.

8. The method of claim 1 wherein the generating step comprises the steps of:

topologically sorting the tasks in accordance with the network to define a sorted list of tasks in the computer system; and sequentially executing a portion of the sequence of computer instructions, the portion including instructions for controlling a test instrument, in the sequence determined by the sorted list to operate the test instrument to provide valid test data and protect the test instrument from abuse.

9. The method of claim 1 wherein the generating step comprises the steps of:

topologically sorting the tasks in accordance with the network to define a sorted list of tasks in the computer system;

assembling a portion of the sequence of computer instructions, the portion including instructions for controlling a test instrument, in the sequence determined by the sorted list to form a program;

compiling the program to form an executable program;

transferring the executable program to a computer controlled test system that corresponds to the data flow process; and executing the executable program on the test system to carry out the data flow process such that the test system produces valid test data.

* * * * *